(12) United States Patent
Ebihara et al.

(10) Patent No.: US 11,476,360 B2
(45) Date of Patent: Oct. 18, 2022

(54) SEMICONDUCTOR DEVICE AND METHOD FOR MANUFACTURING THE SAME

(71) Applicant: DENSO CORPORATION, Kariya (JP)

(72) Inventors: Yasuhiro Ebihara, Kariya (JP); Yuichi Takeuchi, Kariya (JP); Hidefumi Takaya, Toyota (JP); Yukihiro Watanabe, Nagakute (JP)

(73) Assignee: DENSO CORPORATION, Kariya (JP)

( * ) Notice: Subject to any disclaimer, the term of this patent is extended or adjusted under 35 U.S.C. 154(b) by 77 days.

(21) Appl. No.: 17/025,213

(22) Filed: Sep. 18, 2020

(65) Prior Publication Data

US 2021/0005744 A1    Jan. 7, 2021

Related U.S. Application Data

(63) Continuation of application No. PCT/JP2019/011537, filed on Mar. 19, 2019.

(30) Foreign Application Priority Data

Mar. 20, 2018  (JP) .............................. JP2018-053155
Mar. 7, 2019   (JP) .............................. JP2019-041851

(51) Int. Cl.
*H01L 29/78*   (2006.01)
*H01L 29/16*   (2006.01)
(Continued)

(52) U.S. Cl.
CPC ...... *H01L 29/7803* (2013.01); *H01L 29/0878* (2013.01); *H01L 29/0886* (2013.01);
(Continued)

(58) Field of Classification Search
CPC ............. H01L 29/7803; H01L 29/0878; H01L 29/0886; H01L 29/1095; H01L 29/1608;
(Continued)

(56) References Cited

U.S. PATENT DOCUMENTS 7,112,519 B2 *   9/2006   Yamaguchi ......... H01L 29/0634
                                                          438/510
2008/0173876 A1   7/2008   Ueno
(Continued)

FOREIGN PATENT DOCUMENTS

JP    2012-069797 A    4/2012
JP    2014-183105 A    9/2014
(Continued)

*Primary Examiner* — Cuong B Nguyen
(74) *Attorney, Agent, or Firm* — Posz Law Group, PLC

(57) ABSTRACT

A semiconductor device includes: an inversion type semiconductor element that includes: a substrate having a first conductivity type or a second conductivity type; a first conductivity type layer formed on the substrate; a second conductivity type region that is formed on the first conductivity type layer; a JFET portion that is formed on the first conductivity type layer, is sandwiched by the second conductivity type region to be placed; a source region that is formed on the second conductivity region; a gate insulation film formed on a channel region that is a part of the second conductivity type region; a gate electrode formed on the gate insulation film; an interlayer insulation film covering the gate electrode and the gate insulation film, and including a contact hole; a source electrode electrically connected to the source region through the contact hole; and a drain electrode formed on a back side of the substrate.

16 Claims, 24 Drawing Sheets

(51) Int. Cl.
    *H01L 29/66*     (2006.01)
    *H01L 29/10*     (2006.01)
    *H01L 29/08*     (2006.01)
    *H01L 21/02*     (2006.01)
    *H01L 29/423*     (2006.01)

(52) U.S. Cl.
    CPC ...... *H01L 29/1095* (2013.01); *H01L 29/1608* (2013.01); *H01L 29/66068* (2013.01); *H01L 29/7813* (2013.01); *H01L 21/0262* (2013.01); *H01L 21/02529* (2013.01); *H01L 21/02639* (2013.01); *H01L 29/42376* (2013.01); *H01L 29/7811* (2013.01)

(58) Field of Classification Search
    CPC ........... H01L 29/66068; H01L 29/7813; H01L 21/02529; H01L 21/0262; H01L 21/02639; H01L 29/42376; H01L 29/7811; H01L 29/66348; H01L 29/7395; H01L 29/7397; H01L 29/0634; H01L 29/0661; H01L 29/0696; H01L 29/0623; H01L 29/66734
See application file for complete search history.

(56) References Cited

U.S. PATENT DOCUMENTS

| | | | |
|---|---|---|---|
| 2008/0230787 A1* | 9/2008 | Suzuki | H01L 29/7813 257/E29.066 |
| 2014/0103364 A1 | 4/2014 | Nakano et al. | |
| 2015/0076521 A1 | 3/2015 | Tanaka et al. | |
| 2015/0108501 A1 | 4/2015 | Iwamuro et al. | |
| 2015/0325571 A1 | 11/2015 | Nakano et al. | |
| 2016/0027878 A1 | 1/2016 | Uchida et al. | |
| 2016/0344303 A1 | 11/2016 | Nakano et al. | |
| 2017/0054017 A1 | 2/2017 | Takaki et al. | |
| 2018/0138824 A1 | 5/2018 | Nakano et al. | |
| 2019/0260305 A1 | 8/2019 | Nakano et al. | |
| 2020/0212820 A1 | 7/2020 | Nakano et al. | |

FOREIGN PATENT DOCUMENTS

| | | |
|---|---|---|
| JP | 2015-095578 A | 5/2015 |
| JP | 5736683 B2 | 6/2015 |
| JP | 2015-222743 A | 12/2015 |
| JP | 2015-228496 A | 12/2015 |

* cited by examiner

SEMICONDUCTOR DEVICE AND METHOD FOR MANUFACTURING THE SAME

CROSS REFERENCE TO RELATED APPLICATIONS

The present application is a continuation application of International Patent Application No. PCT/JP2019/011537 filed on Mar. 19, 2019, which designated the U.S. and claims the benefit of priority from Japanese Patent Application No. 2018-053155 filed on Mar. 20, 2018 and Japanese Patent Application No. 2019-041851 filed on Mar. 7, 2019. The entire disclosures of all of the above applications are incorporated herein by reference.

TECHNICAL FIELD

The present disclosure relates to a semiconductor device and a method for manufacturing the same, and is particularly suitable when applied to a semiconductor element using a wide band gap semiconductor such as silicon carbide (hereinafter referred to as SiC) and a manufacturing method for the same.

BACKGROUND

In a semiconductor device, it is necessary to reduce on-resistance in order to reduce switching loss or the like. However, when a high drain voltage is applied at a time of short-circuit of a load, a value of a current flowing in a semiconductor element increases in inverse proportion to the on-resistance of a semiconductor element. In other words, as a semiconductor element having an on-resistance value becomes smaller, a value of a saturation current at the time of the load short-circuit becomes larger. As a result, the semiconductor element is likely to be damaged by self-heating, so that a withstand capacity of the SiC semiconductor device at the time of the load short-circuit is reduced. Therefore, there is a trade-off relationship between the reduction of the on-resistance and the improvement of the withstand capacity of the SiC semiconductor device at the time of the load is short-circuit. However, the improvement in this trade-off relationship, that is, compatibility between low on-resistance value and low saturation current, is desired.

SUMMARY

A semiconductor device includes: an inversion type semiconductor element that includes: a substrate having a first conductivity type or a second conductivity type; a first conductivity type layer formed on the substrate; a second conductivity type region that is formed on the first conductivity type layer; a JFET portion that is formed on the first conductivity type layer, is sandwiched by the second conductivity type region to be placed; a source region that is formed on the second conductivity region; a gate insulation film formed on a channel region that is a part of the second conductivity type region; a gate electrode formed on the gate insulation film; an interlayer insulation film covering the gate electrode and the gate insulation film, and including a contact hole; a source electrode electrically connected to the source region through the contact hole; and a drain electrode formed on a back side of the substrate.

DETAILED DESCRIPTION

Figure 1:
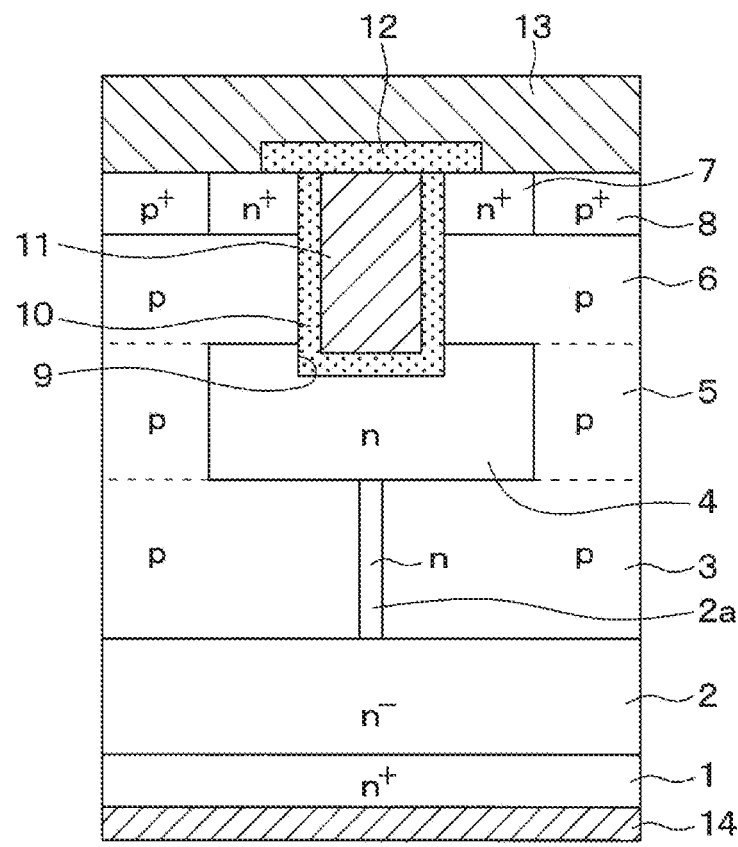
FIG. 1 is a cross-sectional view of a SiC semiconductor device according to a first embodiment.

For implementing both the low on-resistance value and the low saturation current, in a configuration of the comparative example, an impurity concentration of a portion of a p type base region in vicinity of a channel is different from that of a JFET portion. Specifically, the impurity concentration of the p type base region is made to have a gradient in the depth direction so that the impurity concentration is low near the channel and becomes higher in a direction toward the bottom. In such a configuration, since the impurity concentration of the p type base region is low near the channel, it is possible to implement the low on-resistance. In addition, the JFET portion of the p type base region is provided with a desired impurity concentration so as to pinch off the n type drift layer between the adjacent p type base regions, so that a low saturation current can be implemented. Accordingly, it may be possible to achieve both low on-resistance value and low saturation current.

However, in the SiC semiconductor device of a comparative example, the JFET resistance increases when the impurity concentration of the JFET portion of the p type base region is increased or an interval of adjacent p type base regions at the JFET portion is decreased so that a higher withstand current is obtained as a lower saturation current. Therefore, it is impossible to achieve both low on-resistance value and low saturation current.

When the p type layer portion of the JFET portion is large, the region of the gate insulation film with respect to a drain surface effectively becomes small. Therefore, there is an advantage that the feedback capacitance becomes small. However, as described above, there is the difficulty that the JFET resistance increases.

One example of the present disclosure provides a semiconductor device capable of achieving both low on-resistance value and low saturation current, and a method for manufacturing the same.

According to one example embodiment, a semiconductor device includes: an inversion type semiconductor element that includes: a substrate having a first conductivity type or a second conductivity type and made of semiconductor; a first conductivity type layer formed on the substrate and made of a semiconductor having the first conductivity type with an impurity concentration lower than an impurity concentration of the substrate; a second conductivity type region that is formed on the first conductivity type layer, and is made of a semiconductor having the second conductivity type; a JFET portion that is formed on the first conductivity type layer, is sandwiched by the second conductivity type region to be placed, and has, at least, a striped shape when the JFET portion is viewed from a normal direction of the substrate; a source region that is formed on the second conductivity region, and is made of a semiconductor having the first conductivity type and a concentration higher than a concentration of the first conductivity type layer; a gate insulation film formed on a channel region that is a part of the second conductivity type region; a gate electrode formed on the gate insulation film; an interlayer insulation film covering the gate electrode and the gate insulation film, and including a contact hole; a source electrode electrically connected to the source region through the contact hole; and a drain electrode formed on a back side of the substrate, forms the channel region by applying a gate voltage to the gate electrode and applying a voltage at a normal operation as a drain voltage to the drain electrode, and causes a current to flow between the source electrode and the drain electrode through the source region and the JFET portion. In such a configuration, when the voltage at the normal operation is applied as the drain voltage, the JFET portion causes the current to flow while suppressing an extension amount of a depletion layer extending from the second conductivity type region. When a voltage higher than the voltage at the normal voltage is applied as the drain voltage, the JFET portion is pinched off by the depletion layer. When a width at the linear portion in the JFET portion is defined as W, a first conductivity type impurity concentration is defined as Nd, a second type impurity concentration of a portion sandwiching the JFET portion in the second conductivity type region is defined as Na, an elementary charge is defined as q, and a dielectric constant of the semiconductor is defined as ε, a mathematical expression of 90 [V]>(q×Nd×(Na+Nd)×W$^2$)/2εNa is satisfied.

According to such a configuration, it may be possible to suppress the extension of the depletion layer into the JFET portion and to suppress a current path from becoming narrow at the normal operation, and therefore, it is possible to achieve low on-resistance. Further, when the voltage becomes higher than the voltage at the normal operation, the JFET portion is pinched off. Therefore, a low saturation current can be maintained. It becomes possible to improve the tolerance of the semiconductor device due to a load short circuit or the like. Accordingly, it may be possible to provide the semiconductor device capable of achieving both low on-resistance value and low saturation current.

The reference numerals in parentheses attached to the components and the like indicate an example of correspondence between the components and the like and specific components and the like in an embodiment to be described below.

Hereinafter, embodiments of the present disclosure will be described with reference to the drawings. In each of the embodiments described below, same or equivalent parts are designated with the same reference numerals.

First Embodiment

A first embodiment will be described. In a SiC semiconductor device according to the present embodiment, as shown in FIG. 1, a vertical MOSFET is formed as a semiconductor element. The vertical MOSFET is formed in a cell region of the SiC semiconductor device, and the SiC semiconductor device is configured by forming an outer peripheral withstand voltage structure so as to surround the cell region. However, only the vertical MOSFET is illustrated here. In the following description, a horizontal direction in FIG. 1 is taken as a width direction, and a vertical direction is taken as a thickness direction or a depth direction.

In the SiC semiconductor device, an n$^+$ type substrate 1 made of SiC is used as a semiconductor substrate. An n$^-$ type low concentration layer 2 made of SiC is formed on a main surface of the n$^+$ type substrate 1. On the n$^-$ type low concentration layer 2, a JFET portion 2$a$ made of n type SiC and a p type deep layer 3 made of p type SiC are formed. The n$^-$ type low concentration layer 2 corresponds to a first conductivity type layer, and is connected to the JFET portion 2$a$ at a position apart from the n$^+$ type substrate 1, that is, on the opposite side to the n$^+$ type substrate 1. The p type deep layer 3 made of SiC is formed on both sides of this JFET portion 2$a$. The JFET portion 2$a$ has a strip shape extending along the longitudinal direction of a trench gate structure described later, that is, a linear shape. The p type deep layer 3 is formed around the JFET portion 2$a$, and thereby the p type deep layer 3 also has the strip shape.

The n$^+$ type substrate 1 has the (0001) Si plane at its surface and has, for example, an n type impurity concentration of 5.9×10$^{18}$/cm 3, and a thickness of 100 μm. For example, the n$^-$ type low concentration layer 2 has an n type impurity concentration of 6.0×10$^{15}$ to 2.0×10$^{16}$/cm$^3$, here, has the n type impurity concentration of 1.0×10$^{16}$/cm$^3$. The n$^-$ type low concentration layer 2 has a thickness of 6 to 13 μm, for example, 8.0 μm here.

For example, the JFET portion 2$a$ has an n type impurity concentration of 3.0×10$^{17}$ to 3.0×10$^{18}$/cm$^3$, and, here, has the n type impurity concentration of 1.3×10$^{18}$ to 1.4×10$^{18}$/cm$^3$. For example, the JFET portion 2$a$ has a width of 0.3 μm or less, and, here, has the width of 0.1 μm. For example, the p type deep layer 3 has a p type impurity concentration of 5.0×10$^{17}$ to 2.0×10$^{18}$/cm$^3$, and, here, has the p type impurity concentration of 1.1×10$^{18}$ to 1.2×10$^{18}$/cm$^3$. The p type deep layer 3 has a thickness of 1.0 μm, for example.

An n type current dispersion layer 4 made of SiC is formed on the JFET portion 2$a$ and the p type deep layer 3, is connected to the JFET portion 2$a$, and has a width wider than that of the JFET portion 2$a$. A p type connection layer 5 made of SiC is formed on the p type deep layer 3, and has a width narrower than that of the p type deep layer 3.

The n type current dispersion layer 4 is a layer that causes the current flowing through the channel region as described layer to be distributed in a width direction. The n type current dispersion layer 4 has a concentration higher than that of the JFET portion 2$a$, and has, for example, an n type impurity concentration of 3×10$^{17}$/cm$^3$ and a width of 0.6 μm. The concentration of the p type connection layer 5 may be same as the concentration of the p type deep layer 3. However, in the present embodiment, the concentration of the p type deep layer 3 is higher than the concentration of the p type connection layer 5. For example, the p type connection layer 5 has a p type impurity concentration of 3×10$^{17}$/cm$^3$, and a width of 0.6 μm.

In the present disclosure, for convenience, the n$^-$ type low concentration layer 2, the JFET portion 2$a$, and the n type current dispersion layer 4 are described as different configurations. However, each of these n type layer functions as a drift layer.

The p type base region 6 made of SiC is formed on the n type current dispersion layer 4 and the p type connection layer 5, and is connected to the p type deep layer 3 via the p type connection layer 5. An n$^+$ type source region 7 made of SiC and an p$^+$ type contact region 8 made of SiC are formed on the p type base region 6. The n$^+$ type source region 7 is formed on a portion corresponding to the n type current dispersion layer 4 in the p type base region 6. The p$^+$ type contact region 8 is formed on a portion corresponding to the p type connection layer 5 in the p type base region 6. The p type base region 6 is electrically connected a source electrode 13 described later through the p$^+$ type contact region 8.

The p type base region 6 has a thickness thinner than that of the p type deep layer 3, and has a p type impurity concentration lower than that of the p type deep layer 3, and has, for example, the p type impurity concentration of 3×10$^{17}$/cm$^3$ and the thickness of 0.3 μm. The n type impurity concentration of the n$^+$ type source region 7 is higher than the concentration of the n type current dispersion layer 4. The p type impurity concentration of the p$^+$ type contact region 8 is higher than that of the p type base region 6.

Furthermore, a gate trench 9 has, for example, a width of 0.8 μm and a depth that is deeper than a depth obtained by adding a total film thickness of the p type base region 6 and the n$^+$ type source region 7 to a depth of 0.2 to 0.4 μm so as to penetrate the p type base region 6 and the n+ type source region 7 and reach the n type current dispersion layer 4. The p type base region 6 and the n+ type source region 7 are placed so as to be in contact with side surfaces of this gate trench 9.

The gate trench 9 is provided in a linear layout with a right and left direction of the paper of FIG. 1 as the width direction, a normal direction of the paper as the longitudinal direction, and an upper and lower direction of the paper as the depth direction. Although the gate trench 9 has an arbitrary width, it is preferable that the width of the JFET portion 2a is smaller than the width of the gate trench 9. In addition, although only one gate trench 6 is shown in FIG. 1, multiple gate trenches 9 are disposed at regular intervals in the left and right direction of the paper so as to be sandwiched between the p type deep layers 3, and formed in a stripe shape. For example, a pitch of the gate trench 9, that is, an arrangement interval between the adjacent gate trenches 9 is set to a cell pitch that is a pitch of one cell of the vertical MOSFET. For example, a half cell pitch is half the cell pitch and is set to 1.55 µm. As described above, although the gate trench 9 has the arbitrary width, here, the width of the gate trench 9 is smaller than the half cell pitch.

Further, a gate insulation film 10 is formed on an inner wall surface of the gate trench 9 including a channel region. The channel region is a portion of the p type base region 6 located on a side surface of the gate trench 9 and, is a channel region connecting the n+ type source region 7 and the n type current dispersion layer 4 when the vertical MOSFET is operated. A gate electrode 11 made of doped Poly-Si is formed on the surface of the gate insulation film 10, and the inside of the gate trench 9 is filled with the gate insulation film 10 and the gate electrode 11.

On the surfaces of the n+ type source region 7 and the p+ type contact region 8 and the surface of the gate electrode 11, a source electrode 13 or the like is formed via an interlayer insulation film 12. The source electrode 13 is made of multiple metals, for example, Ni/Al or the like. In a case of, among multiple metals, at least the n type SiC, specifically, the n+ type source region 7 or the n type dope, a portion contacting to the gate electrode 11 is made of a metal capable of ohmic contact with the n type SiC. In addition, at least a portion contacting with, among the multiple metals, at least the p type SiC, specifically, a portion contacting with the p+ type contact region 8 is made of a metal capable of ohmic contact with the p type SiC. The source electrode 13 is electrically insulated by being formed on the interlayer insulation film 12. The source electrode 13 is electrically connected to the n+ type source region 7 and the p+ type contact region 8 through contact holes formed in the interlayer insulation film 12.

Further, a drain electrode 14 electrically connected to the n+ type substrate 1 is formed on the back side of the n+ type substrate 1. With such a structure, the n channel type vertical MOSFET having an inversion type trench gate structure is formed. The cell region is provided by arranging such vertical MOSFETs for multiple cells. The SiC semiconductor device is provided by forming the outer peripheral voltage withstand structure such as a guard ring (not shown) or the like so as to surround the cell region in which such vertical MOSFETs are formed.

The SiC semiconductor device including the vertical MOSFET configured as described above is operated by, for example, applying a gate voltage Vg of 20 V to the gate electrode 11 in a state where the source voltage Vs is 0 V and the drain voltage Vd is, for example, 1 to 1.5 V. That is, when the gate voltage is applied, the vertical MOSFET performs an operation in which a channel region is formed in a portion of the p type base region 6 that contacts with the gate trench 9 and a current flows between the drain and the source.

At this time, the concentration of the JFET portion 2a is high and the JFET portion 2a is sandwiched by the p type deep layers 3, that is, a configuration having a narrow width is formed. Therefore, this JFET portion 2a functions as a depletion layer adjustment layer, and thereby the following operation is performed.

Figure 2:
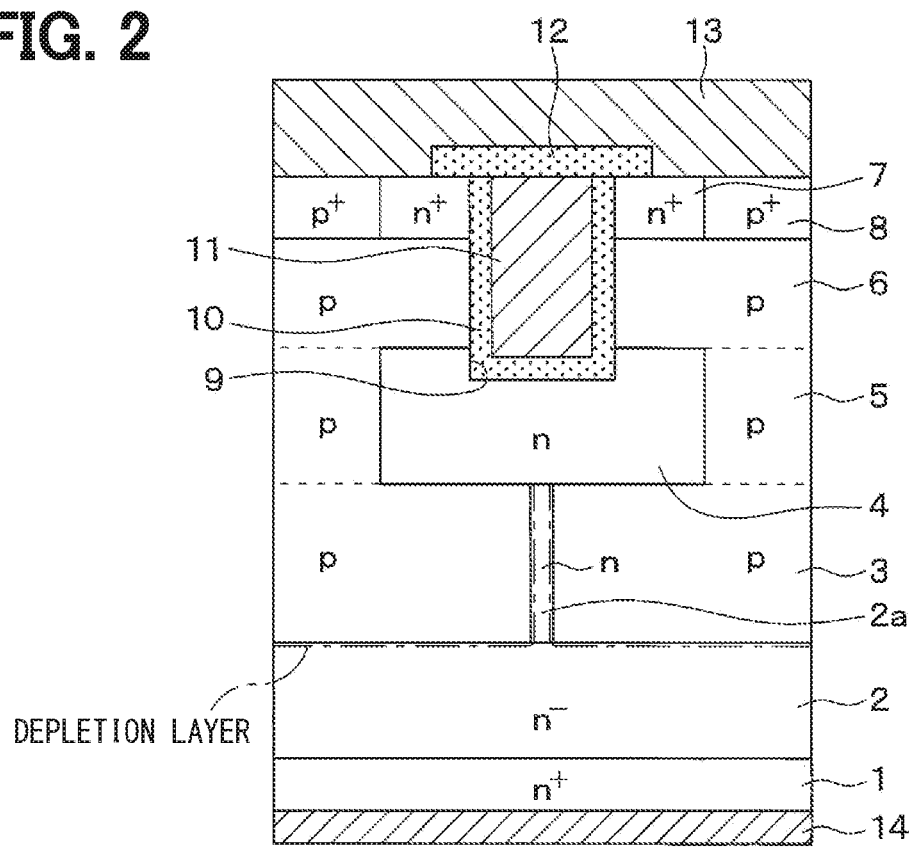
FIG. 2 is a cross-sectional view showing a situation at a normal operation of the SiC semiconductor device shown in FIG. 1.

Specifically, as shown by a long dashed short dashed line of FIG. 2, when the drain voltage Vd is a voltage to be applied at the normal operation such as 1 to 1.5 V, for example, a depletion layer extends from a side of the p type deep layer 3 to the JFET portion 2 and an extending width of the depletion layer is smaller than the width of the JFET portion 2a. That is, the JFET portion 2a functions as a layer that stops the extension of the depletion layer. Therefore, it is possible to suppress the extension of the depletion layer into the JFET portion 2a and to suppress the current path from becoming narrow, and therefore, it becomes possible to achieve the low on-resistance.

Since the JFET portion 2a has a high n type impurity concentration and a low resistance, the JFET portion 2a functions as a current path, and therefore, it is possible to further reduce the on-resistance.

Further, when the drain voltage Vd becomes higher than the voltage during the normal operation due to a load short circuit or the like, the depletion layer extending from the side of the p type deep layer 3 to the JFET portion 2a extends beyond the width of the JFET portion 2a. Then, the JFET portion 2a is immediately pinched off before the n type current dispersion layer 4. Then, the relation between the drain voltage Vd and the width of the depletion layer is determined based on the width of the JFET portion 2a and the impurity concentrations of the JFET portion 2a and the p type deep layer 3. Therefore, the width of the JFET portion 2a and the impurity concentrations of the JFET portion 2a and the p type deep layer 3 are set so that the JFET portion 2a is pinched off when the drain voltage Vd is slightly higher than the drain voltage Vd at the normal operation. Thereby, the JFET portion 2a can be pinched off even at the low drain voltage Vd. In this way, when the drain voltage Vd becomes higher than the voltage at the normal operation, the JFET portion 2a is immediately pinched off, so that a low saturation current can be maintained. It becomes possible to improve the tolerance of the SiC semiconductor device due to the load short circuit or the like.

Accordingly, it may be possible to provide the SiC semiconductor device capable of achieving both low on-resistance value and low saturation current.

In particular, the p type deep layer 3 is projected toward a center line of the gate electrode 11 as compared with the p type base region 6, and thereby the width of the JFET portion 2a is narrowed Therefore, even when the drain voltage Vd becomes a high voltage, the extension of the depletion layer extending from the bottom to the n− type low concentration layer 2 is suppressed by the p type deep layer 3. Thereby, it may be possible to prevent the depletion layer from extending into the trench gate structure. Accordingly, it may be possible to reduce the electric field to the gate insulation film 10, and provide a highly reliable element. In addition, since the extension of the depletion layer to the trench gate structure can be prevented in this way, the n type impurity concentration of the n− type low concentration layer 2 and the JFET portion 2a can be made relatively high, and the low on-resistance can be achieved.

Therefore, it may be possible to obtain a SiC semiconductor device having the vertical MOSFET with the low on-resistance and the high reliability.

The SiC semiconductor device in the present embodiment includes the semiconductor element of a normally-off type in which no current flows between the drain and the source when the gate voltage Vg is not applied, since the channel region is not formed. However, the JFET portion 2a is a normally-on type since it pinches off only when the drain voltage Vd is higher than the voltage at the normal operation, even in the case where the gate voltage Vg is not applied.

Figure 3:
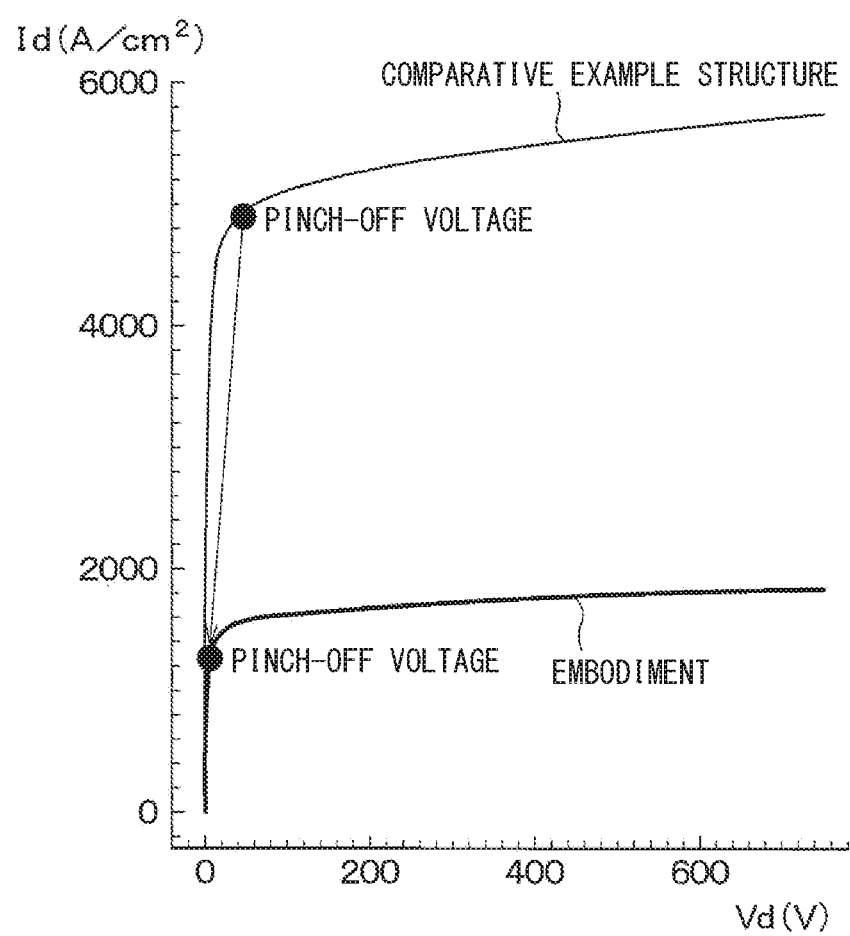
FIG. 3 is a Vd-Id characteristic diagram of a first embodiment structure and a comparative structure.

In a simulation, Vd-Id characteristics of a present embodiment structure having the narrowed width of the JFET portion 2a and the high n type impurity concentration and a comparative example structure are compared. The Vd-Id characteristics are characteristics of a drain current Id with respect to the drain voltage Vd. The comparative example structure is a structure that does not include the p type deep layer 3. In the structure, the p type connection layer 5 is formed so as to reach a depth same as that of the p type deep layer 3, and the n type impurity concentration of the JFET portion 2a is lower than that of the present embodiment. FIG. 3 shows a comparison result obtained by the simulation, and shows characteristics when the gate voltage is 20 [V], the source voltage Vs is 0 [V], and the drain voltage Vd is changed.

As shown in FIG. 3, in the comparative example structure, when the drain voltage Vd is high, the drain current Id, that is, the saturation current value is a large value. On the other hand, in the present embodiment structure, even when the drain voltage Vd becomes high, the saturation current value does not become very large value. For example, when the drain voltage Vd is 650 V (=650 [V]), the drain current Id is 1863 A/cm² (=1863 [A/cm²]). Therefore, the drain current Id is sufficiently reduced as compared with the comparative example structure. The on-resistance could be a low value of 3.3 [mΩcm²].

In such a manner, according to the SiC semiconductor device of the present embodiment, even when the drain voltage Vd becomes the high voltage, the drain current Id can be reduced. Therefore, it may be possible to achieve the low saturation current.

Figure 4:
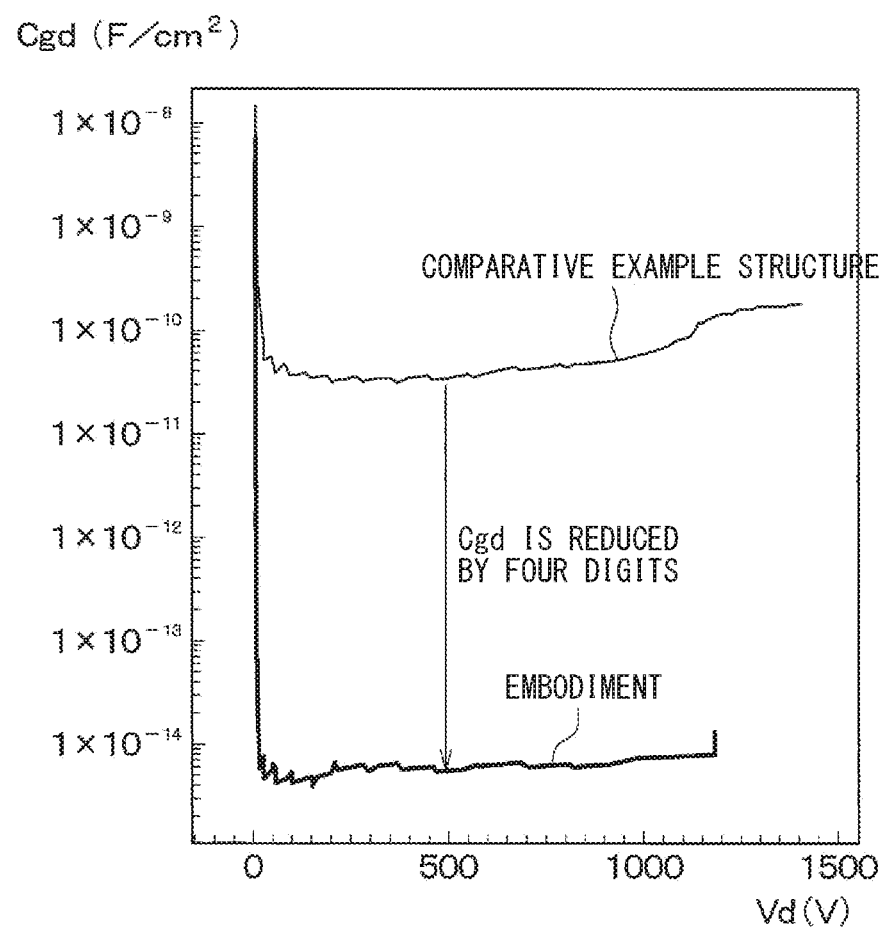
FIG. 4 is a diagram showing a result of comparison of a Vd-Cgd characteristic of a gate-drain capacitance Cgd with respect to a drain voltage Vd for the first embodiment structure and a comparative example structure.

On the other hand, FIG. 4 shows a comparison result of Vd-Cgd characteristics of the present embodiment structure and the comparative example structure. The Vd-Cgd characteristics are characteristics of the gate-drain capacitance Cgd with respect to the drain voltage Vd. As shown in FIG. 4, in the comparative example structure, the gate-drain capacitance Cgd was about 30 [pF]. However, in the present embodiment structure, the gate-drain capacitance Cgd is 30 [fF], that is, reduced by four digits. Thereby, in the present embodiment structure, it may be possible to reduce the gate-drain capacitance Cgd, and improve the switching speed.

Accordingly, as described above, it may be possible to provide the SiC semiconductor device capable of achieving both low on-resistance value and low saturation current. Further, it may be possible to provide the SiC semiconductor device capable of improving the switching speed.

Although the n type impurity concentrations and the dimensions of the JFET portion 2a and the p type deep layer 3 or the like are shown, these are merely examples. For example, the impurity concentrations and the dimensions of the JFET portion 2a and the P type deep layer 3 are set so as to satisfy desired pinch-off conditions.

Specifically, the impurity concentrations and the dimensions of the JFET portion 2a and the p type deep layer 3 are set so that the JFET portion 2a is pinched off earlier than the vertical MOSFET. That is, when the width of the JFET portion 2a is defined as W, the n type impurity concentration is defined as Nd, the p type impurity concentration of the p type deep layer 3 is defined as Na, an elementary charge is defined as q, a dielectric of SiC is defined as ε, the following expression is established.

$$90[V] > (q \times Nd \times (Na+Nd) \times W^2)/2\varepsilon Na \quad \text{(Mathematical expression)}$$

This mathematical expression is set as a condition capable of achieving both low on-resistance and low saturation current. The maximum value indicates the voltage value set as the pinch-off condition, and defines the drain voltage at which the JFET portion 2a surly pinches off even when an activation rate of a process or an ionization rate is taken into consideration.

Next, a method of manufacturing the SiC semiconductor device including the n channel type inversion type trench gate structure vertical MOSFET in the present embodiment will be described with reference to the cross-sectional views in the manufacturing process shown in FIGS. 5A to 5H.

Figure 5A:
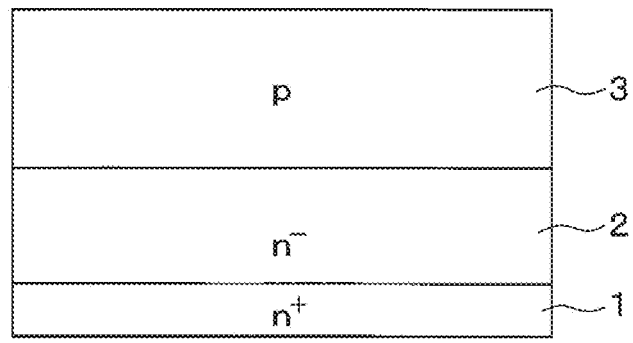
FIG. 5A is a cross-sectional view showing a manufacturing process of the SiC semiconductor device shown in FIG. 1.

[Process Shown in FIG. 5A]

First, the n⁺ type substrate 1 is prepared as the semiconductor substrate. By an epitaxial growth, the n⁻ type low concentration layer 2 made of SiC is formed on the main surface of the n⁺ type substrate 1. Thereafter, further, the p type deep layer 3 made of SiC is formed. The p type deep layer 3 is formed by ion implantation of the p type impurities into a surface layer of the n⁻ type low concentration layer 2 or the epitaxial growth on the n⁻ type low concentration layer 2.

Figure 5B:
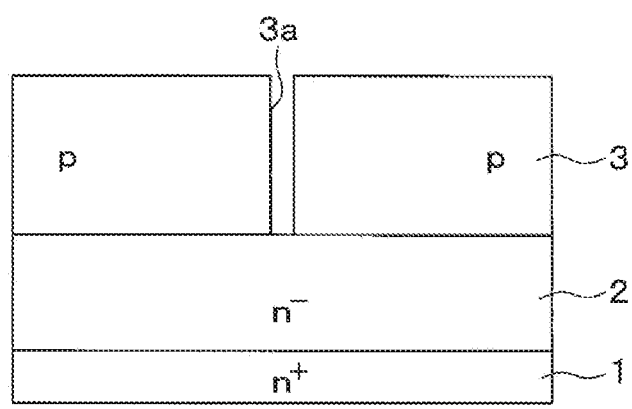
FIG. 5B is a cross-sectional view showing a manufacturing process of the SiC semiconductor device continued from FIG. 5A.

[Process Shown in FIG. 5B]

A mask (not shown) that opens a position corresponding to JFET portion 2a is formed on the p type deep layer 3. By using the mask, the p type deep layer 3 is removed, and a trench 3a is formed. The n⁻ type low concentration layer 2 is exposed at the bottom of the trench 3a.

Figure 5C:
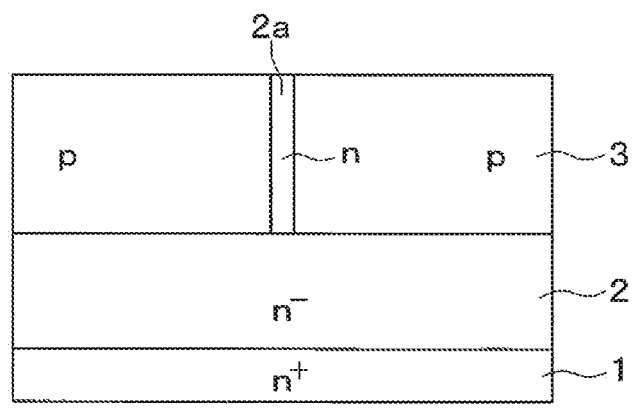
FIG. 5C is a cross-sectional view showing a manufacturing process of the SiC semiconductor device continued from FIG. 5B.

[Process Shown in FIG. 5C]

The JFET portion 2a is formed by selectively performing embedded epitaxial growth in a state where a surface of the p type deep layer 3 other than the trench 3a is covered by the mask. Thereby, the JFET portion 2a is formed so as to fill the trench 3a. Thereafter, the mask (not shown) is removed. The surface of the p type deep layer 3, a high concentration n type layer 20, or the JFET portion 2a are flattened as needed.

Figure 5D:
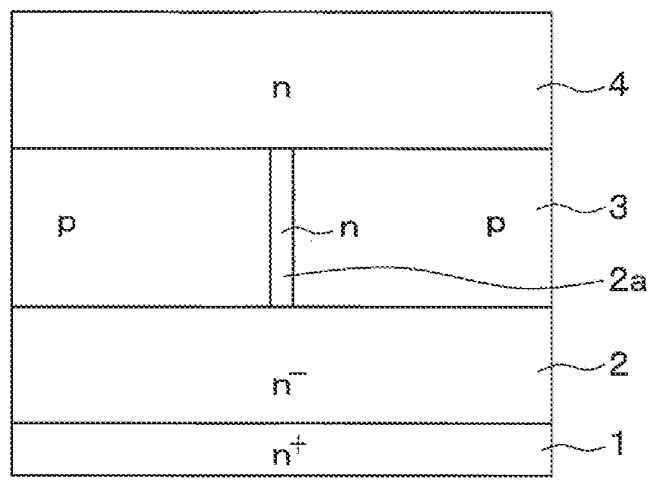
FIG. 5D is a cross-sectional view showing a manufacturing process of the SiC semiconductor device continued from FIG. 5C.

[Process Shown in FIG. 5D]

The n type current dispersion layer 4 is epitaxially grown on the surface of the p type deep layer 3 or the JFET portion 2a.

Figure 5E:
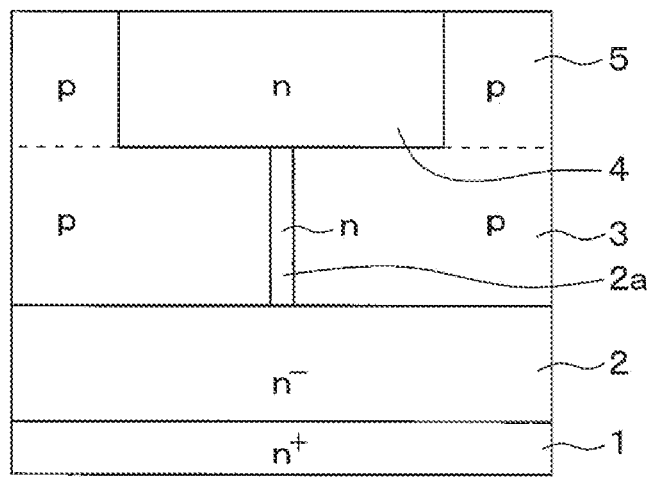
FIG. 5E is a cross-sectional view showing a manufacturing process of the SiC semiconductor device continued from FIG. 5D.

[Process Shown in FIG. 5E]

The p type connection layer 5 is formed by ion-implanting the p type impurity at a position apart from the JFET portion 2a in the n type current dispersion layer 4.

Figure 5F:
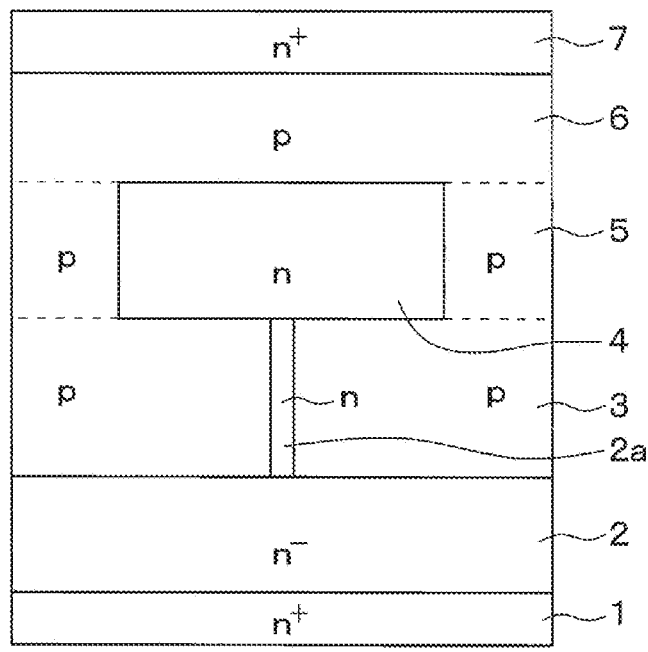
FIG. 5F is a cross-sectional view showing a manufacturing process of the SiC semiconductor device continued from FIG. 5E.

[Process Shown in FIG. 5F]

The p type base region 6 and the n⁺ type source region 7 are epitaxially grown on the n type current dispersion layer 4 and the p type connection layer 5.

Figure 5G:
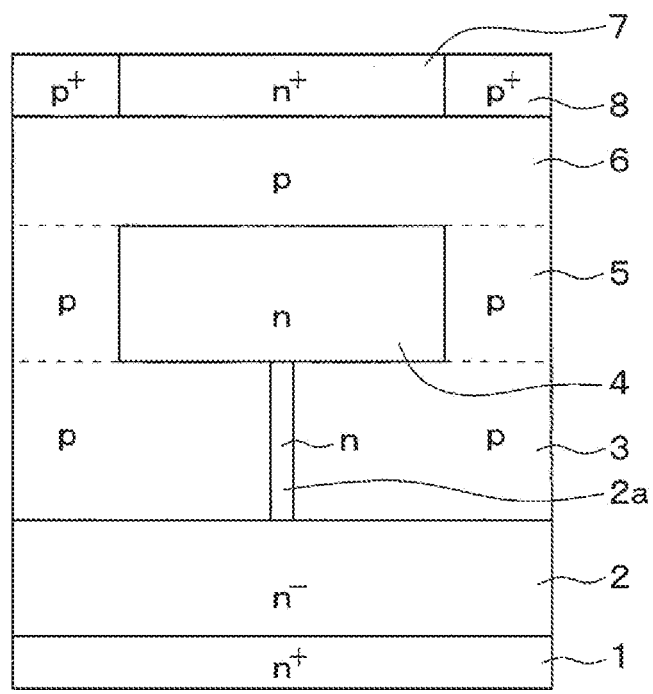
FIG. 5G is a cross-sectional view showing a manufacturing process of the SiC semiconductor device continued from FIG. 5F.

[Process Shown in FIG. 5G]

The p⁺ type contact region 8 is formed by ion-implanting the p type impurity into a part of the n⁺ type source region 7.

Figure 5H:
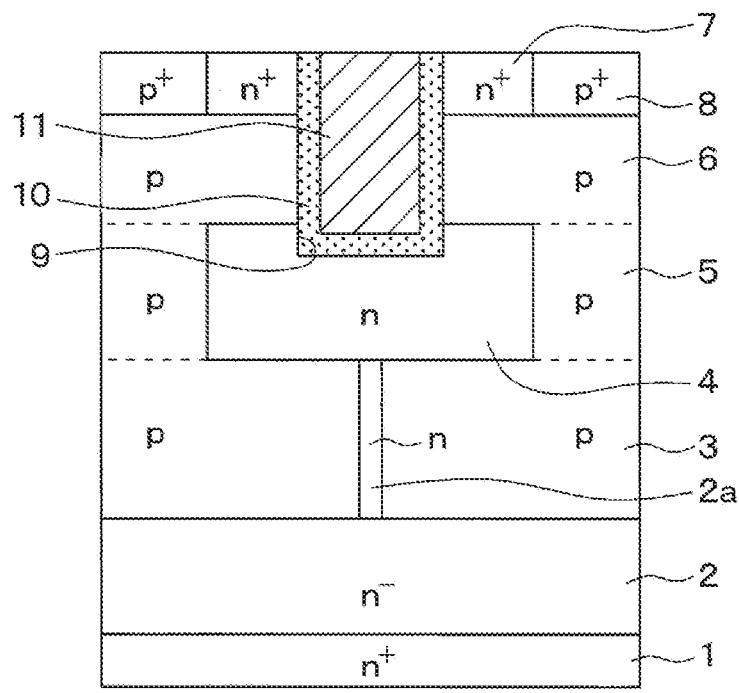
FIG. 5H is a cross-sectional view showing a manufacturing process of the SiC semiconductor device continued from FIG. 5G.

[Process Shown in FIG. 5H]

After a mask (not shown) is formed on the n⁺ type source region 7 or the like, an opening is formed at a portion of the mask where the gate trench 9 is to be formed. Then, by using the mask, the gate trench 9 is formed by performing anisotropic etching such as RIE (Reactive Ion Etching) or the like.

Thereafter, after the mask is formed, for example, thermal oxidation is performed to form the gate insulation film 10, so that the gate insulation film 10 covers an inner wall surface of the gate trench 9 and the surface of the n$^+$ type source region 7. Then, a Poly-Si doped with the p type impurity or the n type impurity is deposited, and then etched back to leave at least the Poly-Si in the gate trenches 9, thereby the gate electrode 11 is formed.

Figure 5I:
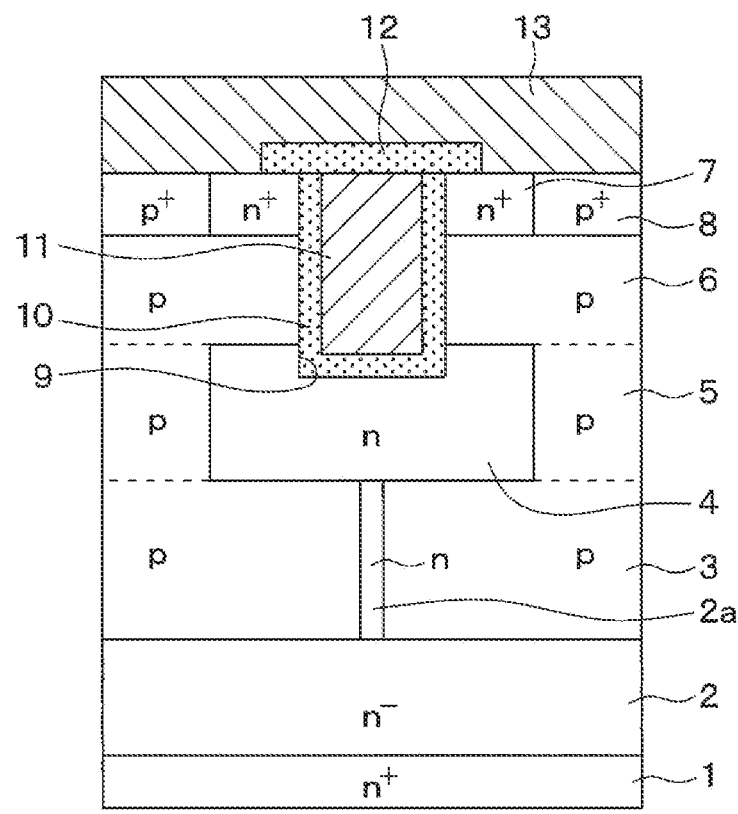
FIG. 5I is a cross-sectional view showing a manufacturing process of the SiC semiconductor device continued from FIG. 5H.

[Process Shown in FIG. 5I]

The interlayer insulation film 12 made of, for example, an oxide film is formed so as to cover the surfaces of the gate electrode 11 and the gate insulation film 10. After the mask (not shown) has been formed on a surface of the interlayer insulation film 12, the mask is opened at portions located between the gate electrodes 11, that is, the portions corresponding to the p$^+$ type contact region 8 and the vicinity of the p type contact region 8. Thereafter, the interlayer insulation film 12 is patterned by using the mask to form contact holes exposing the p$^+$ type contact region 8 and the n$^+$ type source region 7. Then, after the electrode material provided by, for example, a laminated structure of multiple metals is formed on the surface of the interlayer insulation film 12, the source electrode 13 is formed by patterning the electrode material.

Figure 5J:
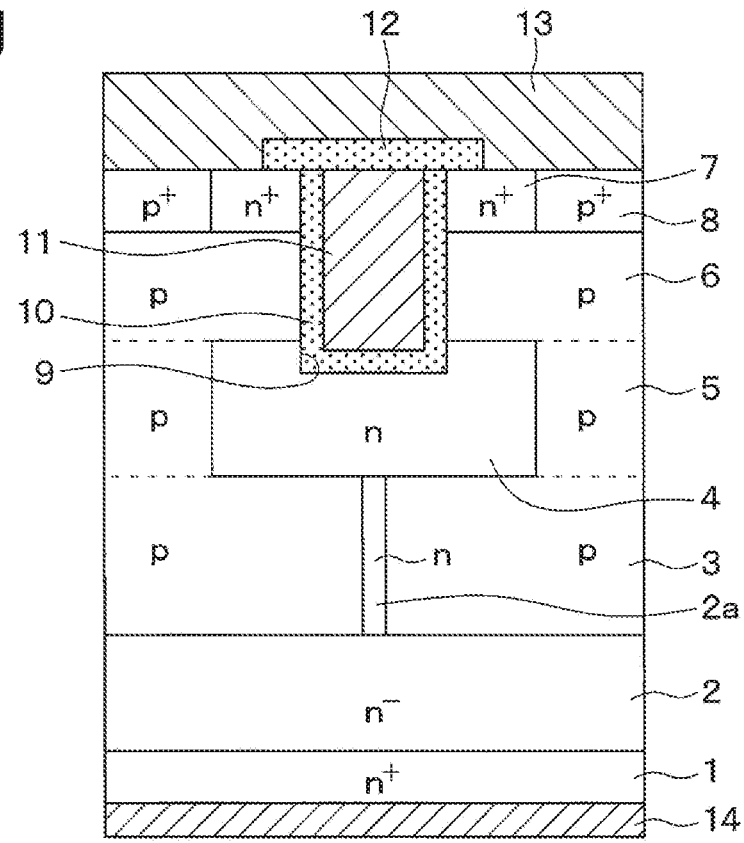
FIG. 5J is a cross-sectional view showing a manufacturing process of the SiC semiconductor device continued from FIG. 5I.

[Process Shown in FIG. 5J]

In addition, the drain electrode 14 is formed on the back side of the n$^+$ type substrate 1. Thereby, the SiC semiconductor device according to the present embodiment is completed.

As described above, the SiC semiconductor device of the present embodiment has a narrow structure in which the JFET portion 2a has the high concentration and the JFET portion 2a is sandwiched by the p type deep layers 3 protruding from both sides. Therefore, at the normal operation, it may be possible to suppress the extension of the depletion layer into the JFET portion 2a and suppress the current path from becoming narrow, and therefore, it becomes possible to achieve the low on-resistance.

Since the JFET portion 2a has the high n type impurity concentration and the low resistance, the JFET portion 2a functions as the current path, and therefore, it is possible to further reduce the on-resistance.

Further, the width of the JFET portion 2a and the impurity concentrations of the JFET portion 2a and the p type deep layer 3 are set so that the JFET portion 2a is pinched off when the voltage is slightly higher than the drain voltage Vd at the normal operation. Thereby, the JFET portion 2a can be pinched off even at the low drain voltage Vd. In such a manner, when the drain voltage Vd becomes higher than the voltage at the normal operation, the JFET portion 2a is immediately pinched off, so that a low saturation current can be maintained. It becomes possible to improve the tolerance of the SiC semiconductor device due to the load short circuit or the like.

Accordingly, it may be possible to provide the SiC semiconductor device capable of achieving both low on-resistance value and low saturation current.

Second Embodiment

A second embodiment will be described. In the present embodiment, the configuration between the JFET portion 2a and the n$^-$ type low concentration layer 2 and the configuration between the p type deep layer 3 and the n$^-$ type low concentration layer 2 are modified with respect to the first embodiment, and the other configurations are similar to the first embodiment. Only features different from the first embodiment will be described.

Figure 6:
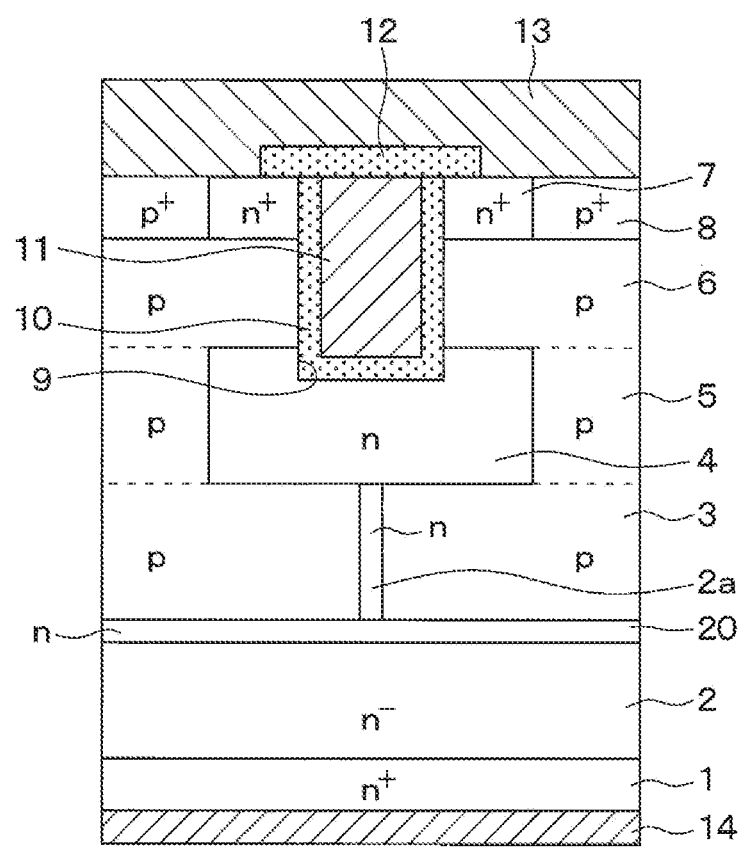
FIG. 6 is a cross-sectional view of a SiC semiconductor device according to a second embodiment.

As shown in FIG. 6, in the present embodiment, the SiC semiconductor device of the first embodiment has a structure that additionally includes a high concentration n type layer 20 at a boundary position between the JFET portion 2a and the n$^-$ type low concentration layer 2 and between the p type deep layer 3 and the n$^-$ type low concentration layer 2.

The concentration of the high concentration n type layer 20 is higher than the concentration of the n$^-$ type low concentration layer 2. Here, the impurity concentration of the high concentration n type layer 20 is same as the impurity concentration of the JFET portion 2a. However, the impurity concentration of the high concentration n type layer 20 may be different from the impurity concentration of the JFET portion 2a. A thickness of the high concentration n type layer 20 is, for example, 0.07 μm.

In such a manner, when the high concentration n type layer 20 is arranged be the JFET portion 2a and the p type deep layer 3, it is possible to further reduce the on-resistance in accordance with the high concentration n type layer 20. When the high concentration n type layer 20 is not included, the extension of the depletion layer extending from the p type deep layer 3 towards the n$^-$ type low concentration layer 2 may become larger as compared with the case where the high concentration n type layer 20 is included. The current path of the n$^-$ type low concentration layer 2 in vicinity of the JFET portion 2a may be narrowed.

Accordingly, the high concentration n type layer 20 is included as shown in the present embodiment, and thereby it may be possible to suppress the current path of the n$^-$ type low concentration layer 2 in the vicinity of the JFET portion 2a, and may be possible to more achieve the low on-resistance.

Note that the method for manufacturing the SiC semiconductor device of the present embodiment is almost the same as the first embodiment. That is, after the n$^-$ type low concentration layer 2 is formed as described in the first embodiment, next, the high concentration n type layer 20 is forming by increasing the introduction amount of gas that becomes the n type impurity or the like. Thereafter, by performing each of the process of FIG. 5B and subsequent processes, the SiC semiconductor device of the present embodiment can be manufactured.

Modification of First Embodiment and Second Embodiment

Figure 7A:
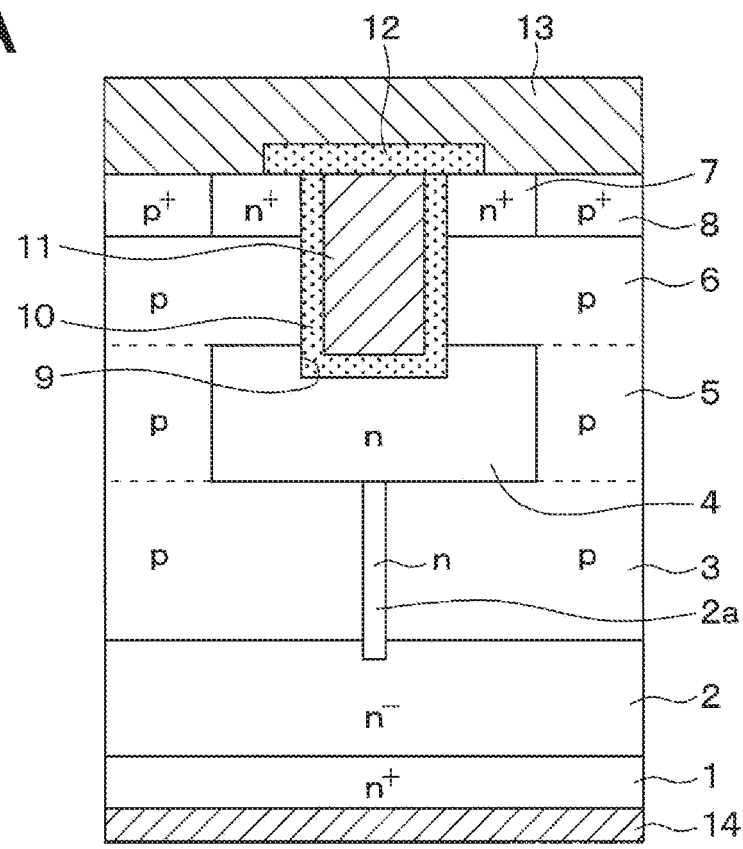
FIG. 7A is a cross-sectional view of a SiC semiconductor device described according to a modification of the first embodiment and the second embodiment.
Figure 7B:
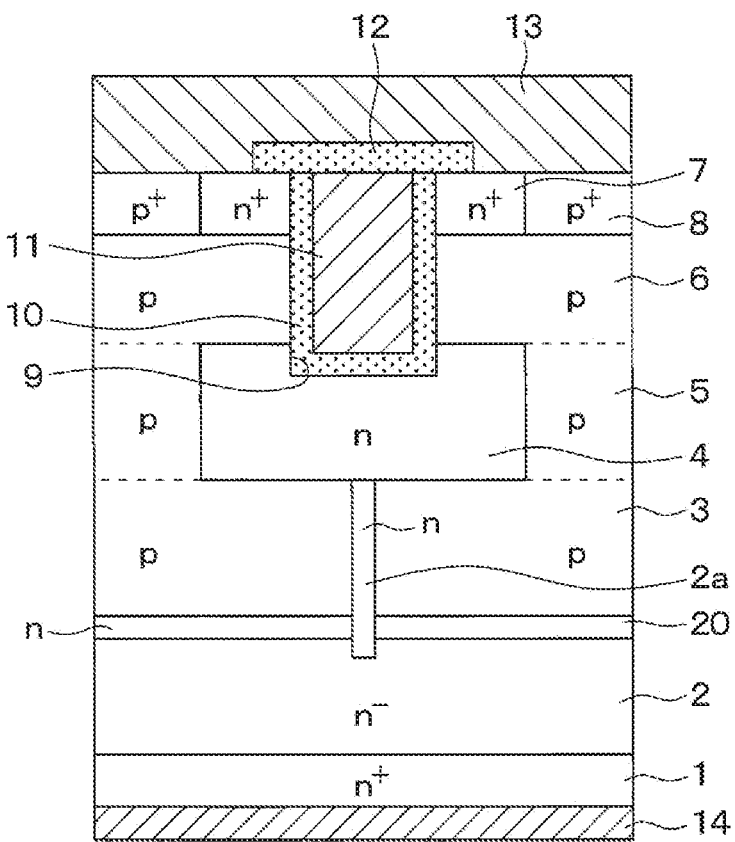
FIG. 7B is a cross-sectional view of a SiC semiconductor device described according to a modification of the first embodiment and the second embodiment.

The structures described in the first embodiment and the second embodiment described above may be structures, as shown in FIG. 7A and FIG. 7B, in which the JFET portion 2a protrudes to a position lower than the p type deep layer 3, more specifically, the n$^-$ type low concentration layer 2.

Even in the case of these structures, it may be possible to obtain the effects similar to the first embodiment and the second embodiment, and, in addition, it may be possible to reduce the on-resistance by the reduction amount in accordance with the protrusion of the JFET portion 2a of which concentration is higher than that of the n$^-$ type low concentration layer 2. Further, in the case of the structure of FIG. 7A, the extension of the depletion layer extending from the p type deep layer 3 to the side of the n$^-$ type low concentration layer 2 is suppressed by the protrusion portion of the JFET portion 2a. Accordingly, it may be possible to suppress the current path of the n$^-$ type low concentration layer 2 in the vicinity of the JFET portion 2a, and may be possible to more achieve the low on-resistance.

Third Embodiment

A third embodiment will be described. The present embodiment is the similar to the first and second embodiments except that a super junction structure is applied to the first and second embodiments. Only the differences from the first and second embodiments will be described. Here, a case where the super junction structure is applied to the vertical MOSFET of the structure of the first embodiment will be described. However, the super junction structure can be applied to the vertical MOSFET having the high concentration n type layer 20 as shown in the second embodiment.

Figure 8:
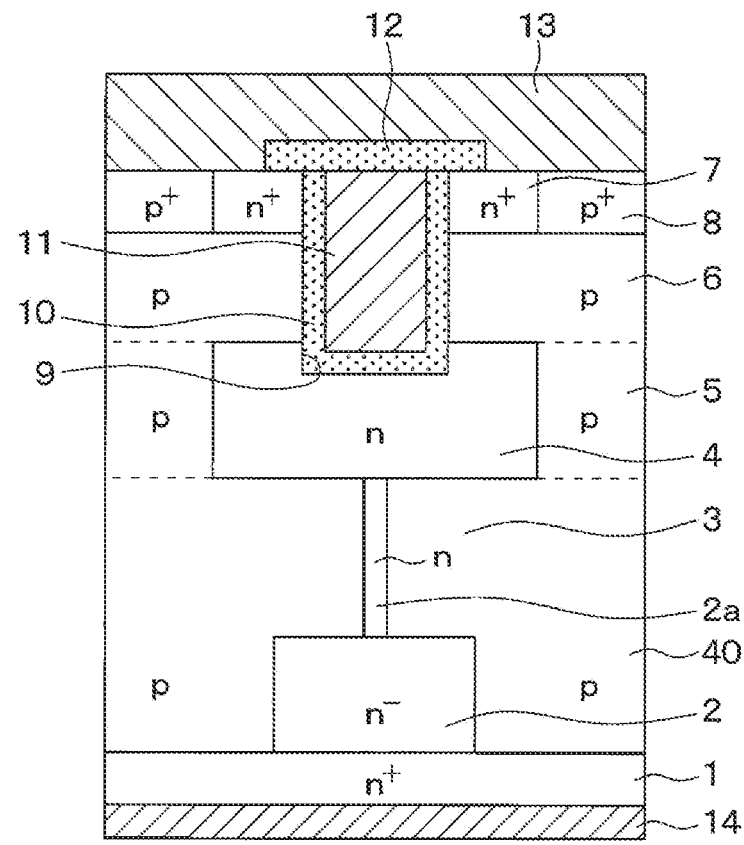
FIG. 8 is a cross-sectional view of a SiC semiconductor device according to a third embodiment.

As shown in FIG. 8, in the present embodiment, a p type column layer 40 extending toward the n type low concentration layer 2 at a position lower than the p type deep layer 3 is included. In FIG. 8, the p type column layer 40 is in contact with the $n^+$ type substrate 1. However, the p type column layer 40 may be separated from the $n^+$ type substrate 1.

In such a manner, by forming the p type column layer 40, the PN junction super junction structure in which the $n^-$ type low concentration layer 2 is the n type column layer is formed. In the vertical MOSFET having such a super junction structure, the JFET portion 2a and the P type deep layer 3 are formed as in the first embodiment, so that it may be possible to obtain the similar effects to the first embodiment.

The SiC semiconductor device of the present embodiment structure can be basically manufactured by the similar manufacturing method to that of the first embodiment. The p type column layer 40 can be formed by forming the trench in the $n^-$ type low concentration layer 2, performing the embedded epitaxial growth, and further etching back to flatten the surface of the p type column layer 40. Except for this, the SiC semiconductor device can be manufactured by the similar method to that of the first embodiment.

Fourth Embodiment

A fourth embodiment will be described. The present embodiment is obtained by changing the contact structure of the source electrode 13 in the first to third embodiments, and the other configuration is the similar to the first to third embodiments, and therefore only the portions different from the first to third embodiments will be described. Here, it will be described that the change of the contact structure of the source electrode 13 is applied to the vertical MOSFET in the first embodiment. However, the change may be applied to the vertical MOSFETs in the second and third embodiments.

Figure 9:
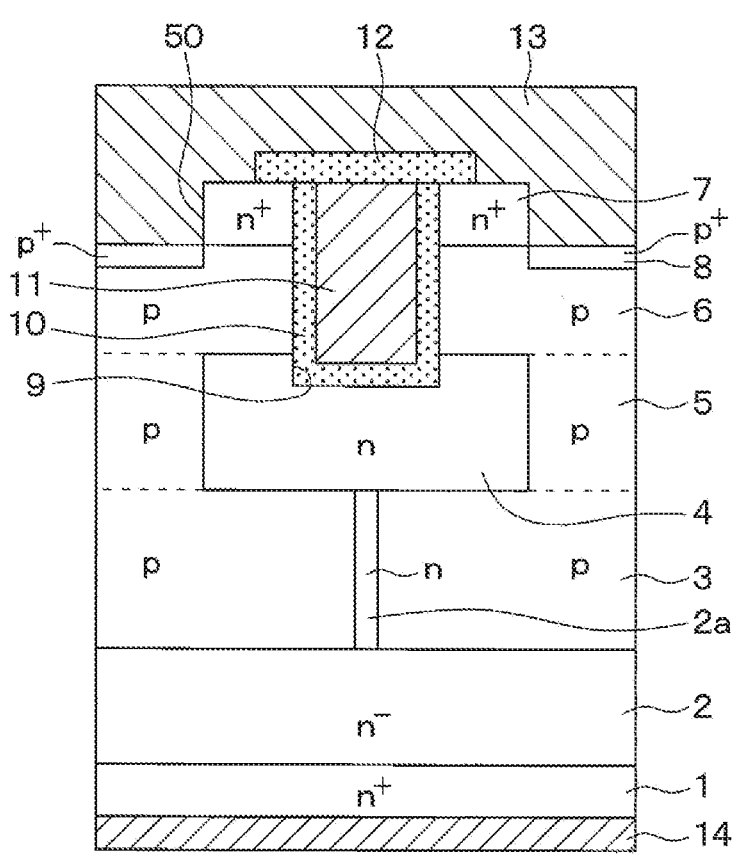
FIG. 9 is a cross-sectional view of a SiC semiconductor device according to a fourth embodiment.

As shown in FIG. 9, contact trench 50 is formed on the opposite side of the trench gate structure and sandwiches the $n^+$ type source region 7. On the bottom of this contact trench 50, the $p^+$ type contact region 8 is formed at the surface layer portion of the p type base region 6. Such a structure can be implemented by forming the $n^+$ type source region 7, then forming the contact trench 50 by the etching, and thereafter per the ion-implantation for forming the $p^+$ type contact region 8.

In such a manner, the contact between the source electrode 13 and the p type base region 6 may be achieved by the contact trench 50 formed by removing a part of the $n^+$ type source region 7.

Fifth Embodiment

A fifth embodiment will be described. The present embodiment is obtained by changing an upper surface layout of the JFET portion 2a in the first to fourth embodiments, and the other configuration is the similar to the first to fourth embodiments, and therefore only the portions different from the first to fourth embodiments will be described. Here, it will be described that the change of the layout configuration is applied to the vertical MOSFET having the structure in the first embodiment. However, the change may be applied to the vertical MOSFETs in the second to fourth embodiments.

Figure 10:
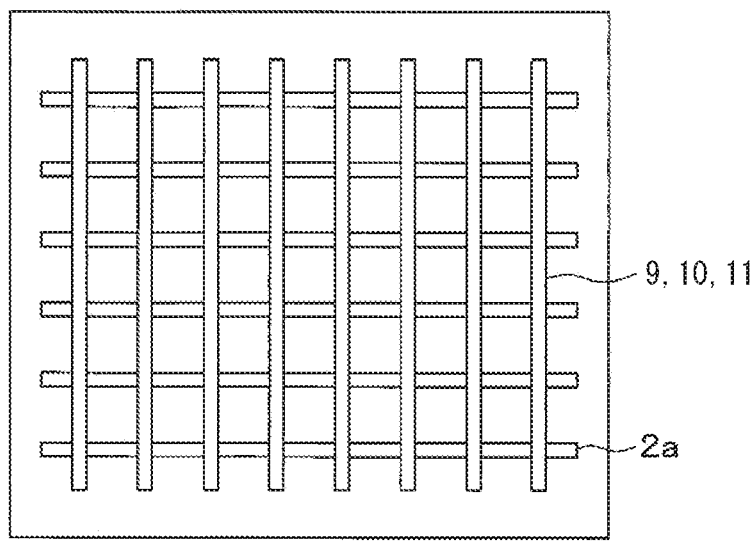
FIG. 10 is an upper surface layout view showing a SiC semiconductor device according to a fifth embodiment.

In the first embodiment described above, the JFET portion 2a is formed in the strip shape along a longitudinal direction of the trench gate structure. On the other hand, in the present embodiment, as shown in FIG. 10, the JFET portion 2a is laid out so as to intersect with the longitudinal direction of the trench gate structure, here, at the right angle. Thereby, the trench gate structure and the JFET portion 2a are laid out in a lattice shape.

In such a manner, even when the trench gate structure and the JFET portion 2a are laid out in the lattice shape, it may be possible to obtain the similar effect to the first embodiment. Also, in this case, the width of the JFET portion 2a indicates a width of each linear shaped portion forming the lattice shape.

Modification of Fifth Embodiment

Figure 11:
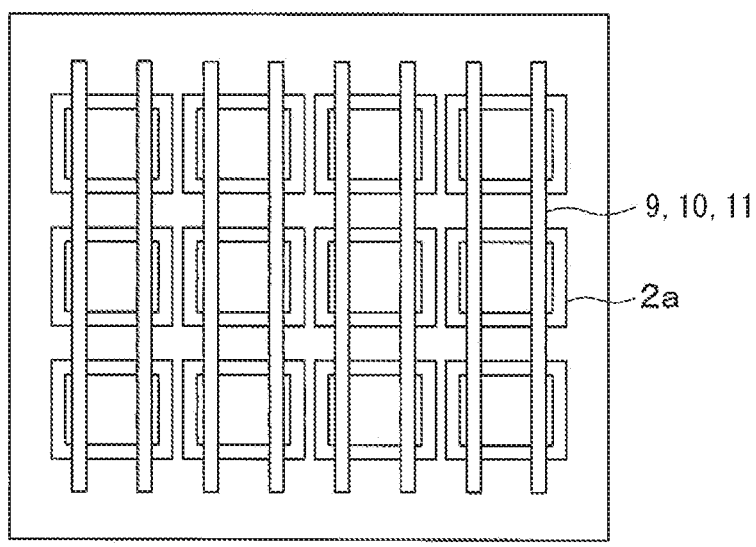
FIG. 11 is an upper surface layout view showing a SiC semiconductor device described according to a modification of the fifth embodiment.

As in the fifth embodiment, the layout is not limited to the layout in which the trench gate structure and the JFET portion 2a are formed in the lattice shape, and may be a different layout. For example, as shown in FIG. 11, the JFET portion 2a may be formed in a frame shape such as a quadrangle, and each JFET portion 2a may be arranged in the lattice shape. In this case, the width of the JFET portion 2a indicates a width of a linear shaped portion of the frame shape.

Sixth Embodiment

A sixth embodiment will be described. In the present embodiment, instead of the vertical MOSFET having the trench gate structure in the first to fifth embodiments, a vertical MOSFET having a planar structure is employed and the other features are similar to the first to fifth embodiments. Only differences from the first to fifth embodiments will be described. Here, it will be described that the planar structure is applied to the vertical MOSFET having the structure in the second embodiment. However, the planar structure can be applied to the vertical MOSFETs having the structure in the first embodiment and the third to fifth embodiments.

Figure 12:
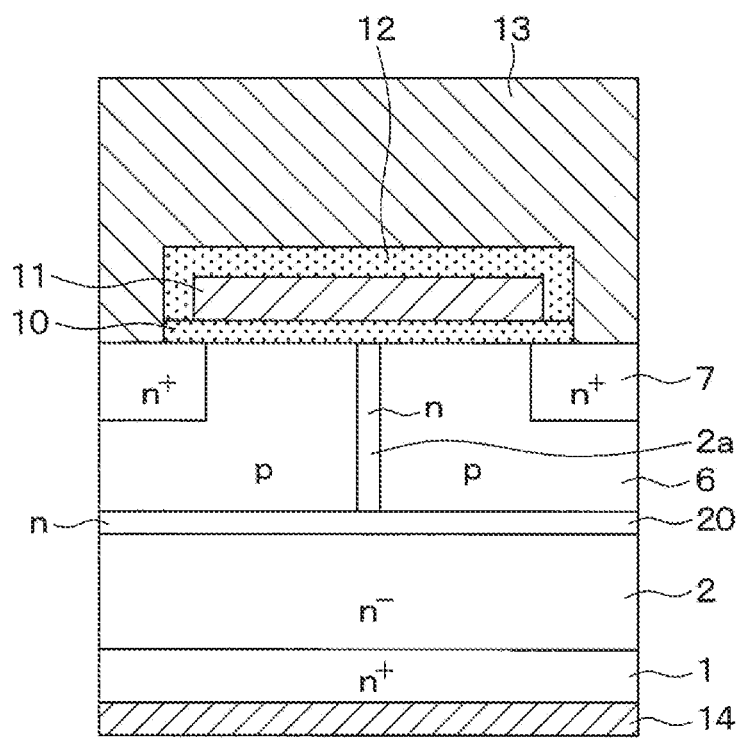
FIG. 12 is a cross-sectional view of a SiC semiconductor device according to a sixth embodiment.

Specifically, the structure having the JFET portion 2a with the high concentration can be applied to the SiC semiconductor device having the vertical MOSFET of the planar structure as shown in FIG. 12. In the case of the planar structure, the high concentration n type layer 20 or the p type base region 6 is formed on the $n^-$ type low concentration layer 2, and the $n^+$ type source region 7 is formed on a surface portion of the p type base region 6. The JFET portion 2a is formed so as to be sandwiched by the P type base regions 6. A surface side of a portion between the $n^+$ type source region 7 and the JFET portion 2a in the p type base region 6 is formed as the channel region. The gate electrode 11 is formed on the channel region through the gate insulation film 10.

Even in such a structure, when, at least, the concentration of the JFET portion 2a between the p type base regions 6 is high and the width satisfies the predetermined pinch-off condition, the similar effect to that of the second embodiment can be obtained.

In the case of the present embodiment, the high concentration n type layer 20 is formed on the upper surface of the n⁻ type low concentration layer 2. Therefore, the amount of the extension of the depletion layer extending from the p type base region 6 to the side of the n⁻ type low concentration layer 2 is also suppressed. It may be possible to more reduce the on-resistance.

Seventh Embodiment

A seventh embodiment will be described. The present embodiment is obtained by changing a formation method of the JFET portion 2a in the first to sixth embodiments, and the other configuration is the similar to the first to sixth embodiments, and therefore only the portions different from the first to sixth embodiments will be described. Here, it will be described that the manufacturing method in the present embodiment is applied to the vertical MOSFET having the structure in the first embodiment. However, the planar structure can be applied to the vertical MOSFETs having the structure in each of the second to sixth embodiments.

In the present embodiment, instead of the embedded epitaxial growth shown in FIGS. 5A to 5C described in the first embodiment, the JFET portion 2a is formed by a different way.

Figure 13A:
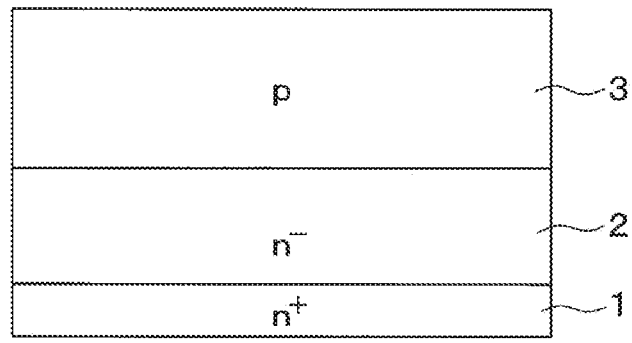
FIG. 13A is a cross-sectional view showing a method for manufacturing a SiC semiconductor device according to a seventh embodiment.
Figure 13B:
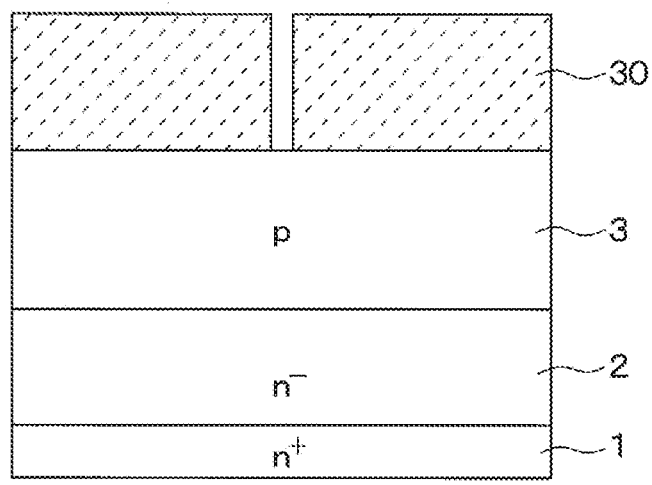
FIG. 13B is a cross-sectional view showing a method for manufacturing the SiC semiconductor device continued from FIG. 13A.
Figure 13C:
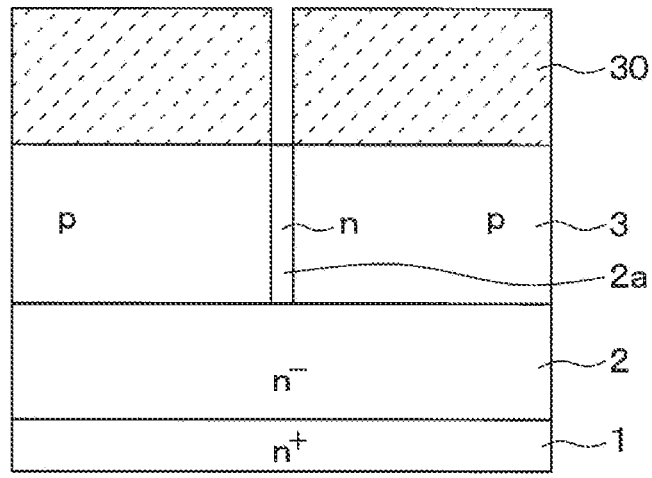
FIG. 13C is a cross-sectional view showing a method for manufacturing the SiC semiconductor device continued from FIG. 13B.

Specifically, as shown in FIG. 13A, the n⁻ type low concentration layer 2 and the p type deep layer 3 are epitaxially grown on the n⁺ type substrate 1. Next, as shown in FIG. 13B, a mask 30 having an opening at a predetermined region, that is, a region where the JFET portion 2a is to be formed is formed on the p type deep layer 3. As shown in FIG. 13C, the JFET portion 2a is formed by ion-implanting the n type impurities from the above of the mask 30 and performing activation annealing. Thereafter, after the mask 30 is removed, the similar processes to FIGS. 5D to 5J are performed. Thereby, the SiC semiconductor device having the vertical MOSFET similar to that of FIG. 1 can be manufactured.

In such a manner, the JFET portion 2a can be also formed by the ion-implantation. Even when the SiC semiconductor device is manufactured by such a manufacturing method, it may be possible to provide the similar effect to the first embodiment.

Eighth Embodiment

An eighth embodiment will be described. The present embodiment is obtained by changing a formation method of the p type connection layer 5 and the p⁺ type contact region 8 in the first to seventh embodiments, and the other configuration is the similar to the first to seventh embodiments, and therefore only the portions different from the first to seventh embodiments will be described. Here, it will be described that the manufacturing method in the present embodiment is applied to the vertical MOSFET having the structure in the first embodiment. However, the planar structure can be applied to the vertical MOSFETs having the structure in the second to seventh embodiments.

Figure 14A:
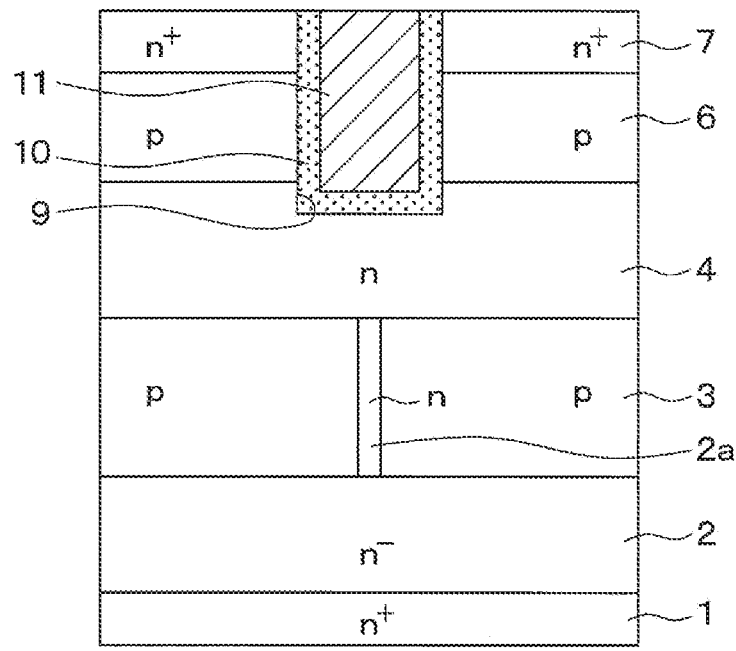
FIG. 14A is a cross-sectional view showing a method for manufacturing a SiC semiconductor device according to an eighth embodiment.
Figure 14B:
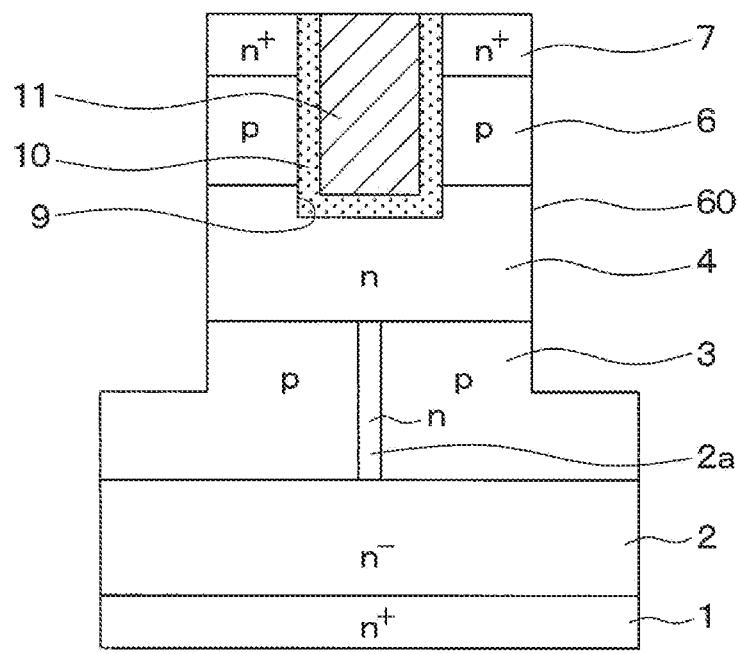
FIG. 14B is a cross-sectional view showing a method for manufacturing the SiC semiconductor device continued from FIG. 14A.
Figure 14C:
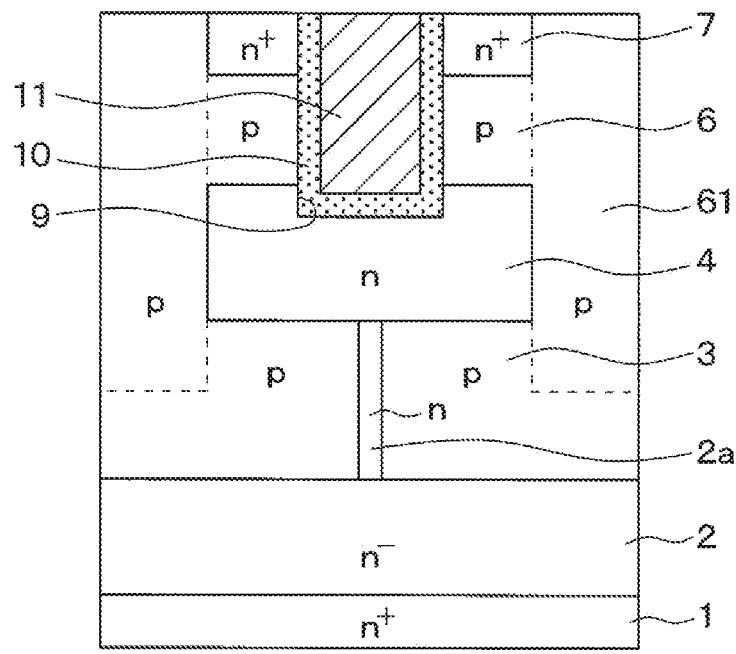
FIG. 14C is a cross-sectional view showing a method for manufacturing the SiC semiconductor device continued from FIG. 14B.

First, the processes shown in FIGS. 5A to 5D described in the first embodiment are performed. Next, as shown in FIG. 14A, the p type connection layer 5 is not formed at the n type current dispersion layer 4, and the p type base region 6 and the n⁺ type source region 7 are formed. Further, the trench gate structure is formed. Thereafter, as shown in FIG. 14B, a trench 60 is formed at a position apart from the trench gate structure, penetrates the n⁺ type source region 7 or the p type base region 6 and the n type current dispersion layer 4, and reaches the p type deep layer 3. As shown in FIG. 14C, a p type layer 61 is formed by the embedded epitaxial growth, and functions as the p type connection layer 5 and the p⁺ type contact region 8.

In such a manner, the p type layer 61 functioning as the p type connection layer 5 and the p⁺ type contact region 8 may be formed by the epitaxial growth.

Ninth Embodiment

A ninth embodiment will be described. The present embodiment provides a more preferable manufacturing process of the JFET portion 2a in the first to sixth embodiments and the eighth embodiment, and the other is the similar to the first embodiment, and therefore only the portions different from the method will be described.

In the first embodiment described above, as shown in FIGS. 5B and 5O, it has been described that the p type deep layer 3 is removed, the trench 3a is formed, the epitaxial growth filling this trench 3a is performed, and thereby the JFET portion 2a is formed. However, for example, when the trench 3a having a narrow width of 0.1 μm or less is filled by the epitaxial growth, it was confirmed that the n type impurity concentration of the JFET portion 2a at the bottom of the trench 3a is higher than that at the shallower position.

Figure 15:
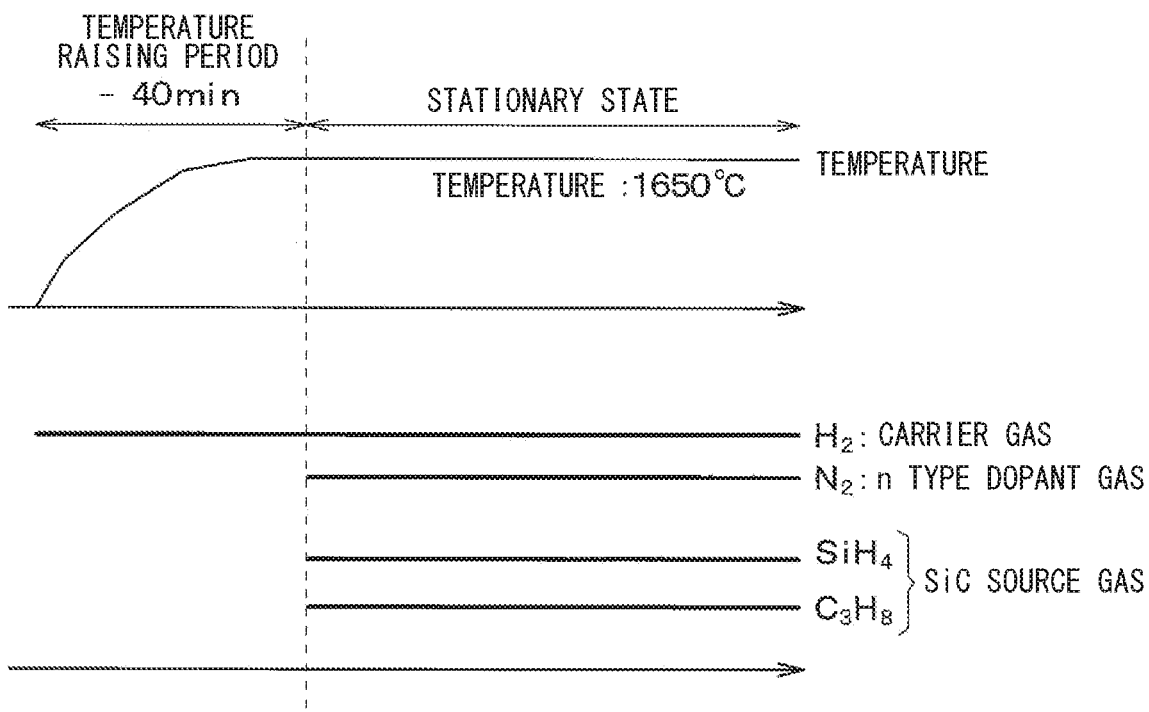
FIG. 15 is a time chart showing a growth profile of an n type impurity layer that forms a JFET portion described as an example in a ninth embodiment.

For example, when the JFET portion 2a is formed, a growth profile shown in FIG. 15 can be applied. First, after the processes until the process shown in FIG. 5B are performed, a sample is placed in an epitaxial growth device. After a temperature rising period, the sample is heated at a predetermined temperature. For example, in the temperature rising period, while H₂ (hydrogen) that becomes carrier gas is introduced in the epitaxial growth device, heating is performed for about 40 minutes, and the temperature of the sample is raised up to 1650° C. While the constant temperature is kept, N₂ (nitrogen) that becomes the n type dopant, SiH₄ (silane) that becomes SiC source gas, and C₃H₃ (propane) are simultaneously supplied.

Figure 16:
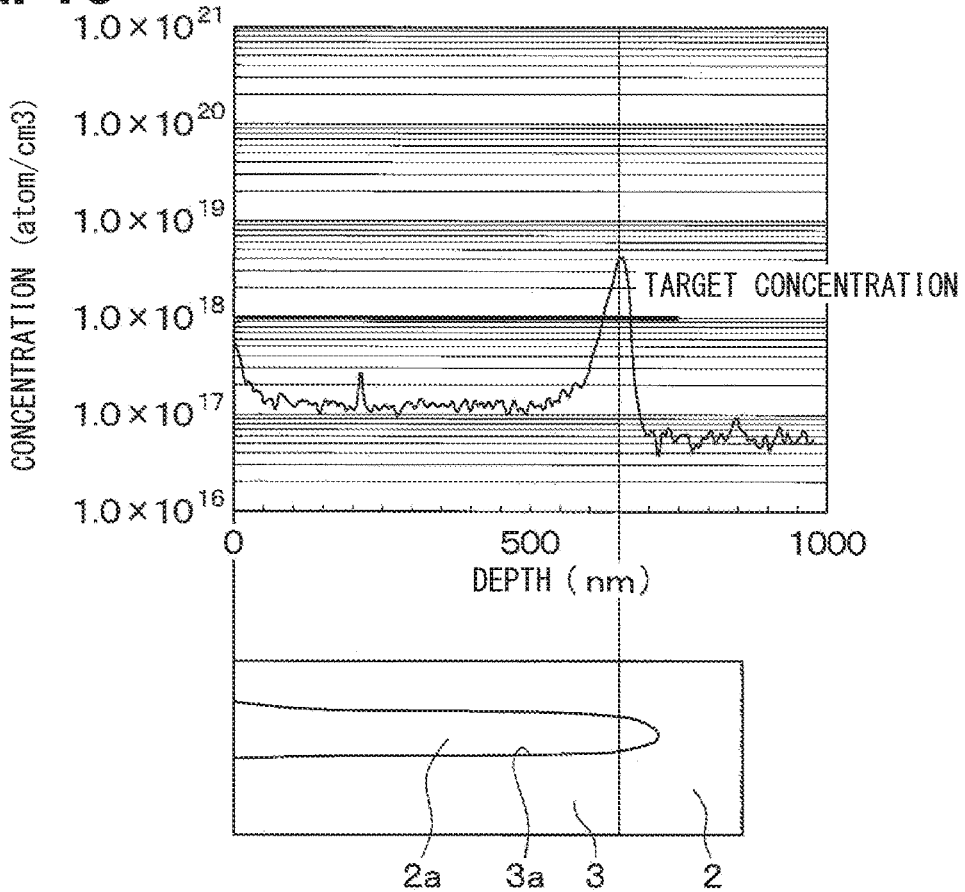
FIG. 16 is a diagram showing a relation between a depth of the JFET portion and the n type impurity concentration.

Even in a case of such a process, the JFET portion 2a can be formed. However, when the n type concentration profile in the depth direction of the JFET portion 2a is confirmed, the n type impurity concentration at the bottom of the trench 3a shown in FIG. 16 is higher than that at the shallower portion. Therefore, for example, the n type impurity concentration of the JFET portion 2a at the bottom of the trench 3a is higher than the target value, and the n type impurity concentration at the shallower portion is lower than the target value. The n type impurity concentration at the higher portion is about $4 \times 10^{18}$ cm⁻³, and the n type impurity concentration at the lower portion is about $1.0 \times 10^{17}$ cm⁻³. There is a difference of one digit or more.

Figure 17:
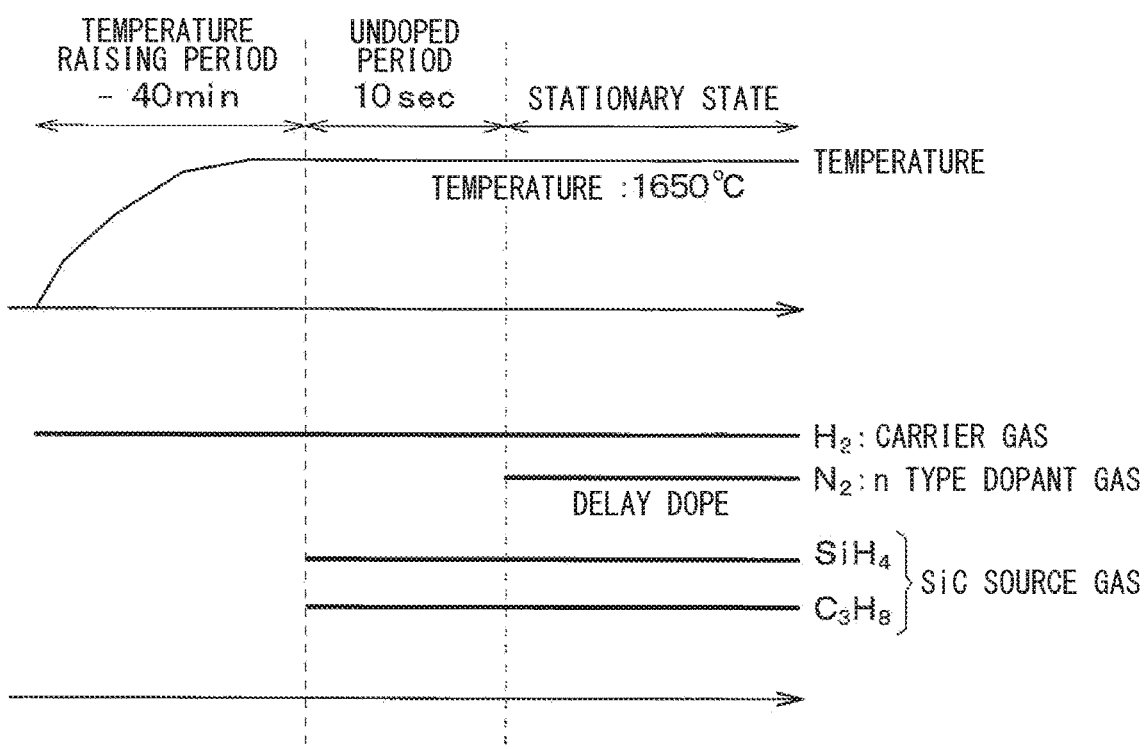
FIG. 17 is a time chart showing a growth profile of an n type impurity layer that forms a JFET portion described as a preferable example in the ninth embodiment.

Accordingly, in the present embodiment, the JFET portion 2a is formed according to the growth profile shown in FIG. 17 so that the n type impurity concentration of the JFET portion 2a more approaches the target value.

Specifically, although the JFET portion 2a is formed according to the similar profile to the above described profile of FIG. 15, the N₂ that becomes the n type dopant is not supplied at an initial stage of the growth when the JFET portion 2a is epitaxially grown after the temperature rising period. That is, at the initial stage of the growth, a undoped period in which only SiH₄ and C₃H₈ that become the SiC source gases are introduced, and the N2 that becomes the n type dopant is not introduced is provided. For example, when the JFET portion 2a is embedded in the trench 3a having the width of 0.1 µm, the JFET portion 2a can be embedded by performing the epitaxial growth for about two minutes. At the initial stage of the growth, the undoped period is set to 5 to 60 seconds, for example, 10 seconds. After the initial stage of the growth, the undoped period elapses. Thereafter, the supply of $N_2$ that becomes n type dopant as a delay dope starts.

When the JFET portion 2a is formed in such a manner, the n type impurity concentration at the bottom of the trench 3a is prevented from becoming high, and the n type impurity concentration in the entire of the JFET portion 2a can be mostly uniformized at the target value.

In such a manner, it may be possible to suppress the n type impurity concentration of the JFET portion 2a from becoming uneven by providing the undoped period when the JFET portion 2a is epitaxially grown. Therefore, the n type impurity concentration of the JFET portion 2a can be brought closer to the target value, and the SiC semiconductor device can have better characteristics.

In the process shown in FIG. 5C described above, the JFET portion 2a is formed by selectively performing the embedded epitaxial growth in a state where the surface of the p type deep layer 3 other than the trench 3a is covered by the mask. However, the mask may be omitted, and the JFET portion 2a may be formed. In this case, the n type SiC for forming the JFET portion 2a is formed outside the trench 3a. However, after the formation of the JFET portion 2a is completed, it may be sufficient to etch back the portion formed outside the trench 3a in the n type SiC to remove the formed portion. As in the present embodiment, when the $H_2$ is used as the carrier gas, the $H_2$ can be used as the etching gas. Therefore, after the formation of the JFET portion 2a is completed and the supply of the $N_2$ that becomes the n type dopant or the $SiH_4$ and $C_3H_8$ that become the SiC source gas is stopped, it may be possible to etch back the unnecessary portion of the n type SiC formed at the time of forming the JFET portion 2a by continuing the supply of the $H_2$. Further, since the unnecessary portion of the n type SiC can be etched back in such a manner, the epitaxial growth of the n type current dispersion layer 4 can be continuously performed by keeping the use of the same epitaxial growth device without lowering the temperature while maintaining the temperature. Subsequently, in a state where the use of the same epitaxial growth device is kept, the p type base region 6 and the $n^+$ type source region 7 can be epitaxially grown without lowering the temperature, and the trench 60 shown in FIG. 14B can be formed. In such a manner, it may be possible to simplify the manufacturing process, and reduce the manufacturing cost.

Tenth Embodiment

A tenth embodiment will be described. The present embodiment provides a more preferable formation process of the trench 3a in which the JFET portion 2a is embedded, the formation process being described in the first embodiment. The other is the similar to the first embodiment, and therefore only the portions different from the first embodiment will be described. This method can be applied to not only the first embodiment but also the second to sixth, eighth, and ninth embodiments.

The process shown in FIG. 5B is described above. In the process, when the trench 3a is formed, the mask opening the position corresponding to the JFET portion 2a is formed on the p type deep layer 3 and the etching using the mask is performed. The trench 3a can be formed by performing the process. However, in a case of using an i-line exposure machine, a minimum formation line width may be lower than, for example, 0.3 µm. The better formation of the narrow width of the trench 3a may not be performed. Therefore, as the formation process of the trench 3a, it is preferable to perform the processes shown in FIGS. 18A to 18G. The process other than the formation process of the trench 3a is similar to that of the first embodiment. Only the formation process of the trench 3a will be described.

Figure 18A:
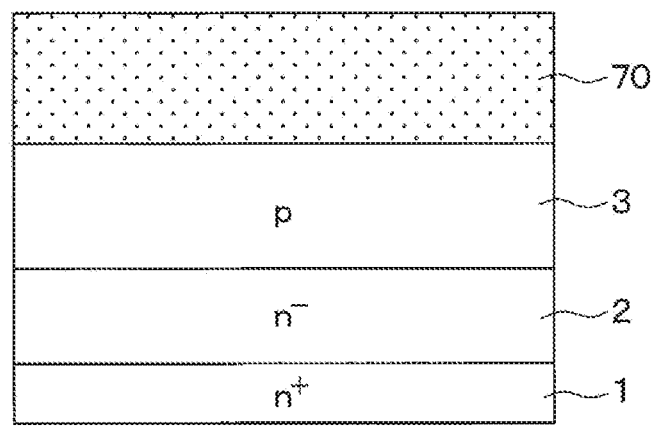
FIG. 18A is a cross-sectional view showing a manufacturing process of a SiC semiconductor device described in a tenth embodiment when a trench having a narrow width is formed.

[Process Shown in FIG. 18A]

First, by performing the above described process shown in FIG. 5A, the $n^-$ type low concentration layer 2 and the p type deep layer 3 are formed on the $n^+$ type substrate 1. A first mask film 70 made of, for example, a TEOS (Tetra Ethyl Ortho Silicate) film is formed on the p type deep layer 3.

Figure 18B:
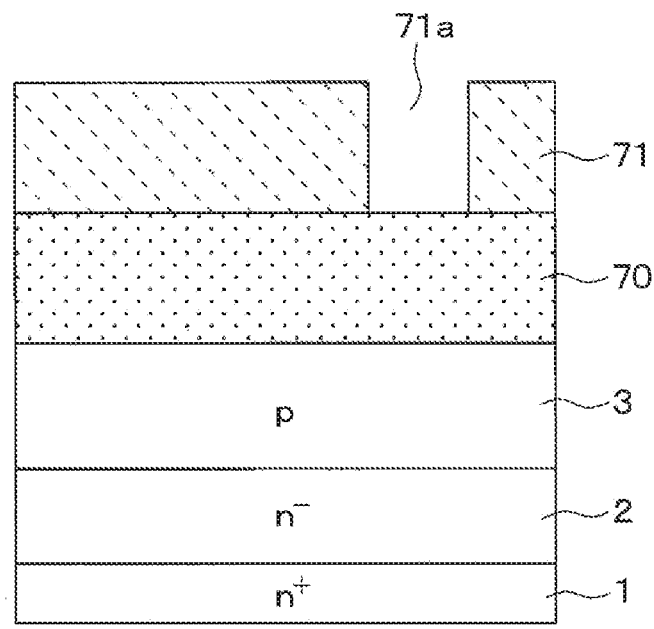
FIG. 18B is a cross-sectional view showing a manufacturing process of the SiC semiconductor device continued from FIG. 18A.

[Process Shown in FIG. 18B]

After a resist 71 is formed on the first mask film 70, the resist 71 is exposed by using an exposure mask (not shown) and further developed to form the resist mask. Then, an opening 71a having a width wider than that of the trench 3a is formed at a position corresponding to a position in which the trench 3a is to be formed. The width of the opening 71a is arbitrary. However, when the width of the trench 3a is, for example, 0.1 µm, the width of the opening 71a is about 0.3 µm.

Figure 18C:
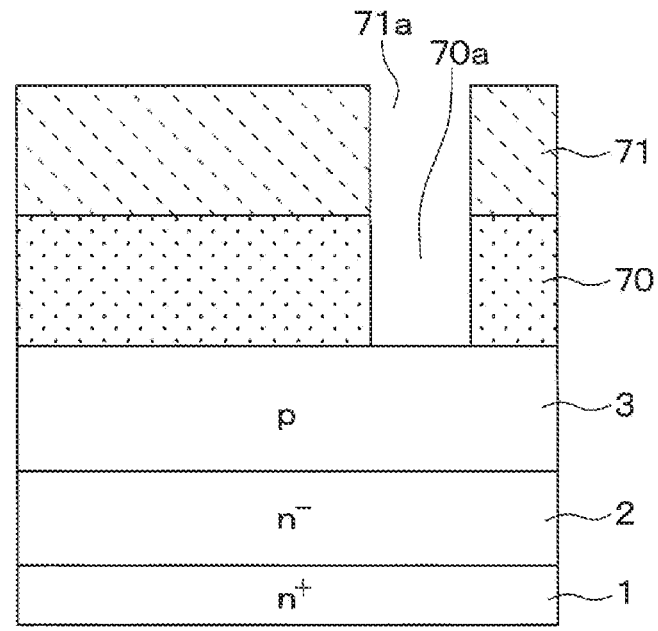
FIG. 18C is a cross-sectional view showing a manufacturing process of the SiC semiconductor device continued from FIG. 18B.

[Process Shown in FIG. 18C]

The first mask film 70 is etched by using the resist 71 as the mask. Thereby, an opening 70a having the same width as the opening 71a of the resist 71 is formed in the first mask film 70.

Figure 18D:
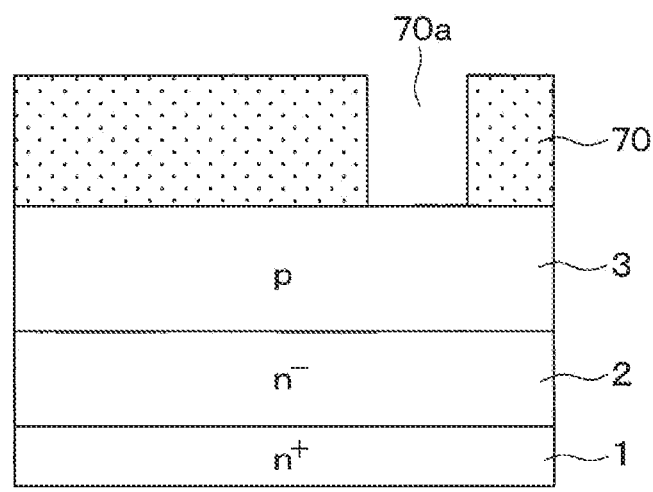
FIG. 18D is a cross-sectional view showing a manufacturing process of the SiC semiconductor device continued from FIG. 18C.

[Process Shown in FIG. 18D]

The resist 71 is peeled, and the first mask film 70 is exposed.

Figure 18E:
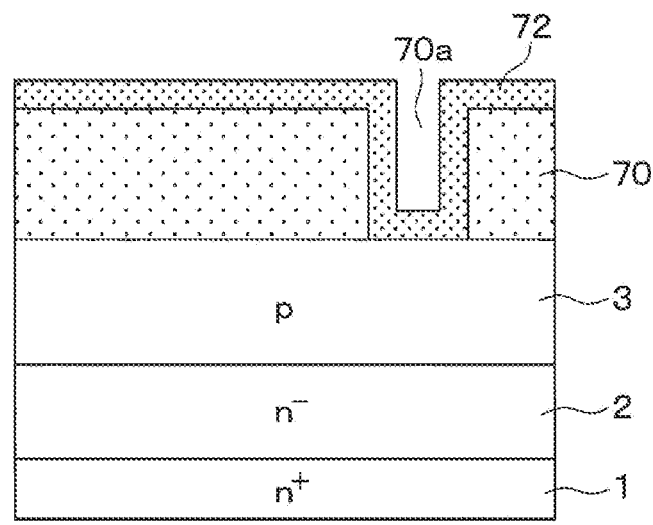
FIG. 18E is a cross-sectional view showing a manufacturing process of the SiC semiconductor device continued from FIG. 18D.

[Process Shown in FIG. 18E]

A second mask film 72 is formed on a side surface of the first mask film 70 in the opening 71a, a surface of the p type deep layer 3, and a surface of the first mask film 70. Then, a film thickness of the second mask film 72 is half the value obtained by subtracting the target width of the trench 3a from the width of the opening 70a. For example, when the width of the opening 70a is 0.3 µm and the target width of the trench 3a is 0.1 µm, the film thickness of the second mask film 72 is 0.1 µm.

Figure 18F:
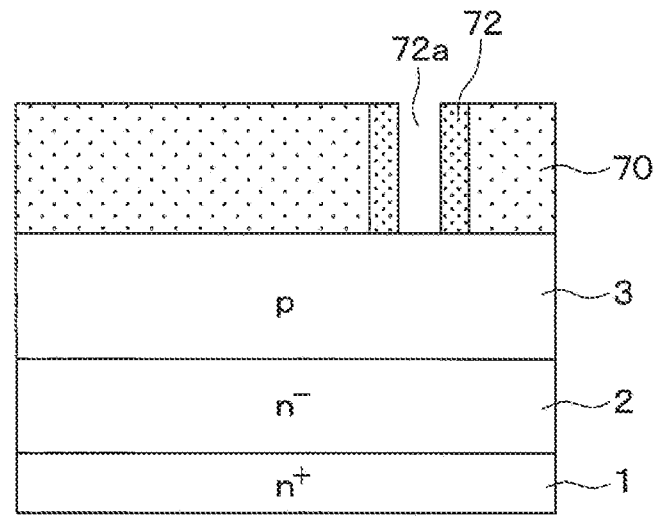
FIG. 18F is a cross-sectional view showing a manufacturing process of the SiC semiconductor device continued from FIG. 18E.

[Process Shown in FIG. 18F]

The second mask film 72 is removed by anisotropic etching. Thereby, the second mask film 72 on the surface of the first mask film 70 and the second mask film 72 on the surface of the p type deep layer 3 in the opening 70a are removed, and the second mask film 72 only on the side surface of the first mask film 70 in the opening 70a remains. Therefore, an opening 72a is formed by the second mask film 72. A width of the opening 72a is equal to the target width of the trench 3a. The opening 72a having a line width narrower than that of the opening 70a can be formed.

Figure 18G:
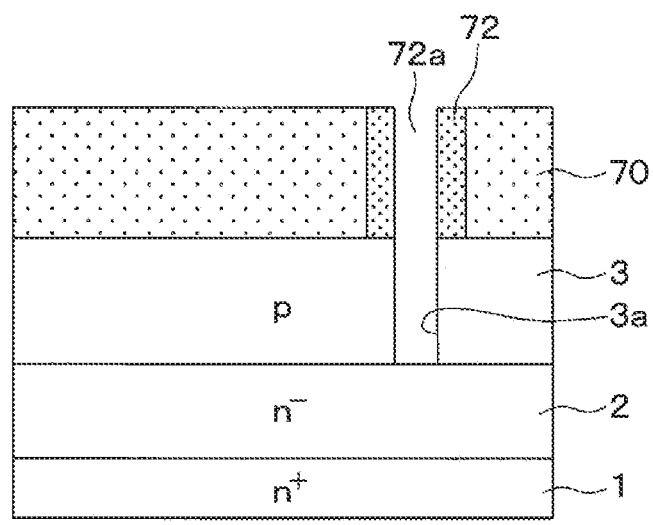
FIG. 18G is a cross-sectional view showing a manufacturing process of the SiC semiconductor device continued from FIG. 18F.

[Process Shown in FIG. 18G]

By using the first mask film 70 and the second mask film 72 as the mask, a portion exposed from the opening 72a in the p type deep layer 3 is etched. Thereby, it may be possible to satisfactorily form the trench 3a having the target width of, for example, 0.1 µm.

As described above, when the trench 3a having the narrow width is formed, the second mask film 72 is placed in the opening 70a formed in the first mask film 70. Thereby, the opening 72a having the narrower line width is obtained. Thereby, the trench 3a having the dimension exceeding a resolution of the i-line exposure machine, that is, the width narrower than the minimum formation line width can be satisfactorily formed.

Such a trench formation process is not limited to a case of forming the JFET portion 2a, and may be applied to a case of forming a trench for different purposes.

Eleventh Embodiment

The present embodiment shows one example of a case where the an outer peripheral withstand voltage structure is also formed in an outer peripheral region that surrounds the cell region in each of the embodiments described above. Here, an example in which the vertical MOSFET having the structure of the first embodiment is formed in the cell region will be described. However, the similar applies to each of the embodiments other than the first embodiment.

Hereinafter, with reference to FIGS. 19A to 19I, the manufacturing method of the SiC semiconductor device including the cell region and the outer peripheral region will be described. However, a portion related to the cell region will be briefly described with reference to the first embodiment.

Figure 19A:
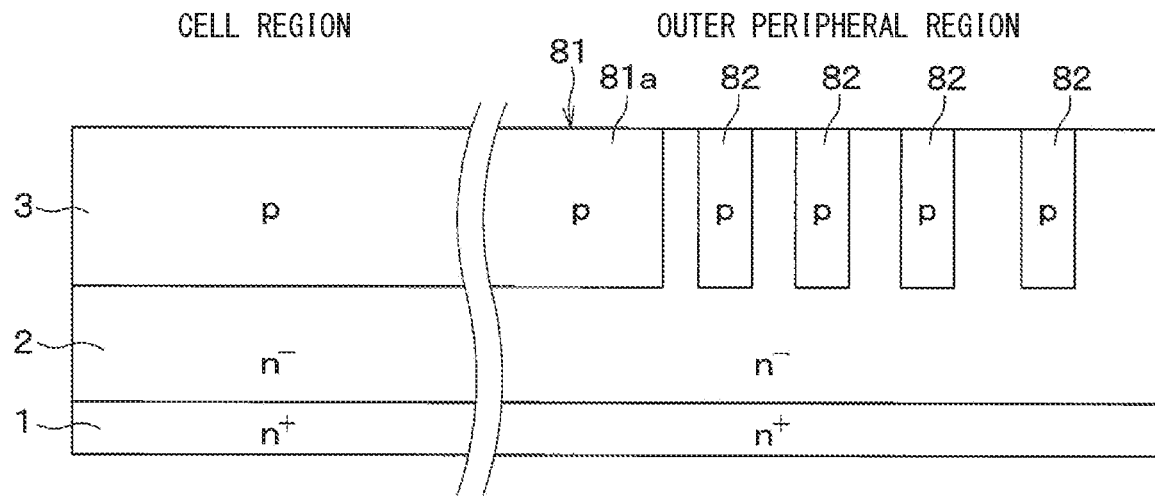
FIG. 19A is a cross-sectional view showing a manufacturing process of a SiC semiconductor device according to an eleventh embodiment.

In a process shown in FIG. 19A, similarly to the process shown in FIG. 5A, after the $n^+$ type substrate 1 is prepared as the semiconductor substrate, the $n^-$ type low concentration layer 2 is formed on the main surface of the $n^+$ type substrate 1. Simultaneously with formation of the p type deep layer 3, a lower layer 81a of a p type RESURF layer 81 and a p type guard ring layer 82 are formed.

Figure 19B:
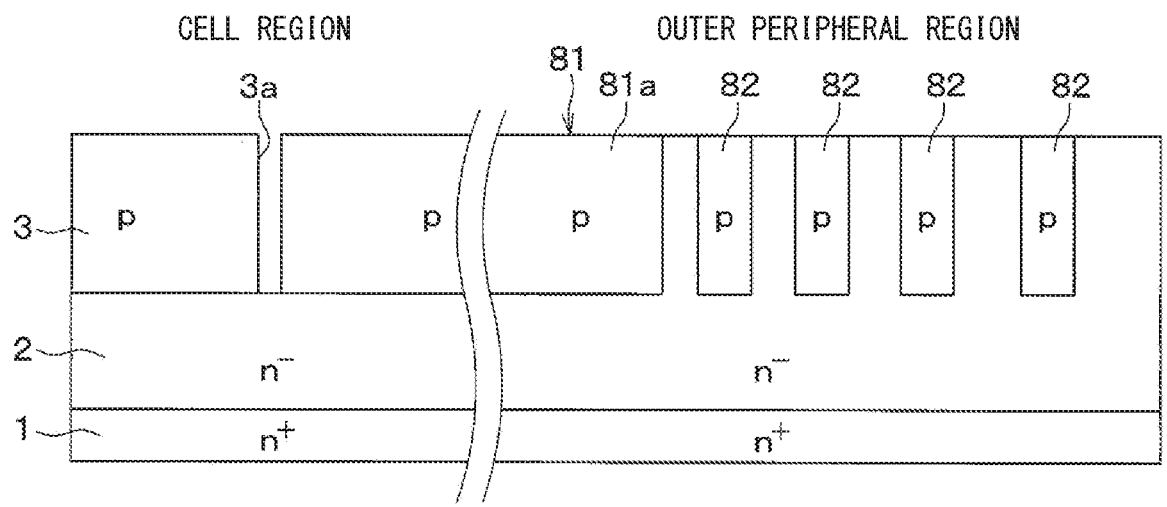
FIG. 19B is a cross-sectional view showing a manufacturing process of the SiC semiconductor device continued from FIG. 19A.
Figure 19C:
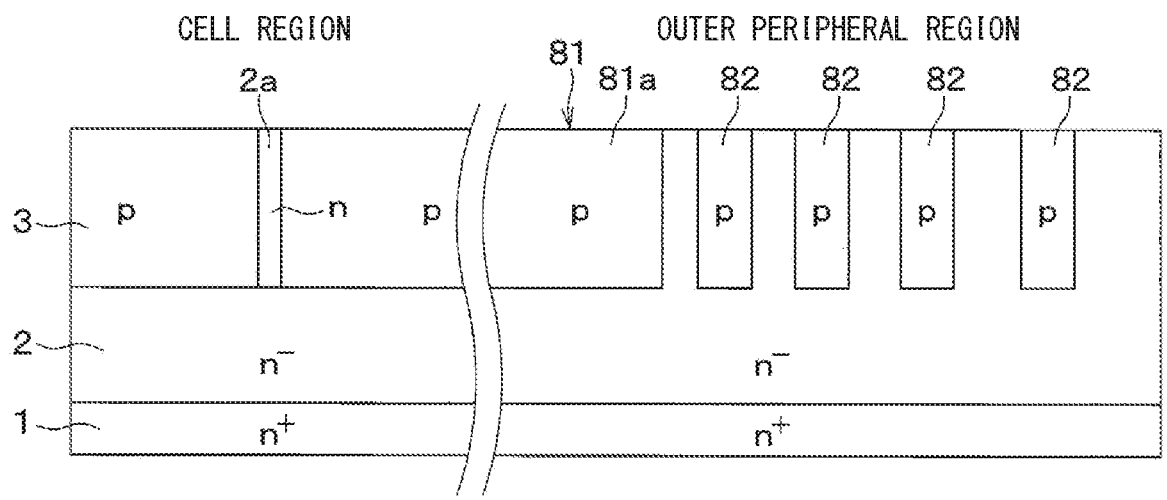
FIG. 19C is a cross-sectional view showing a manufacturing process of the SiC semiconductor device continued from FIG. 19B.
Figure 19D:
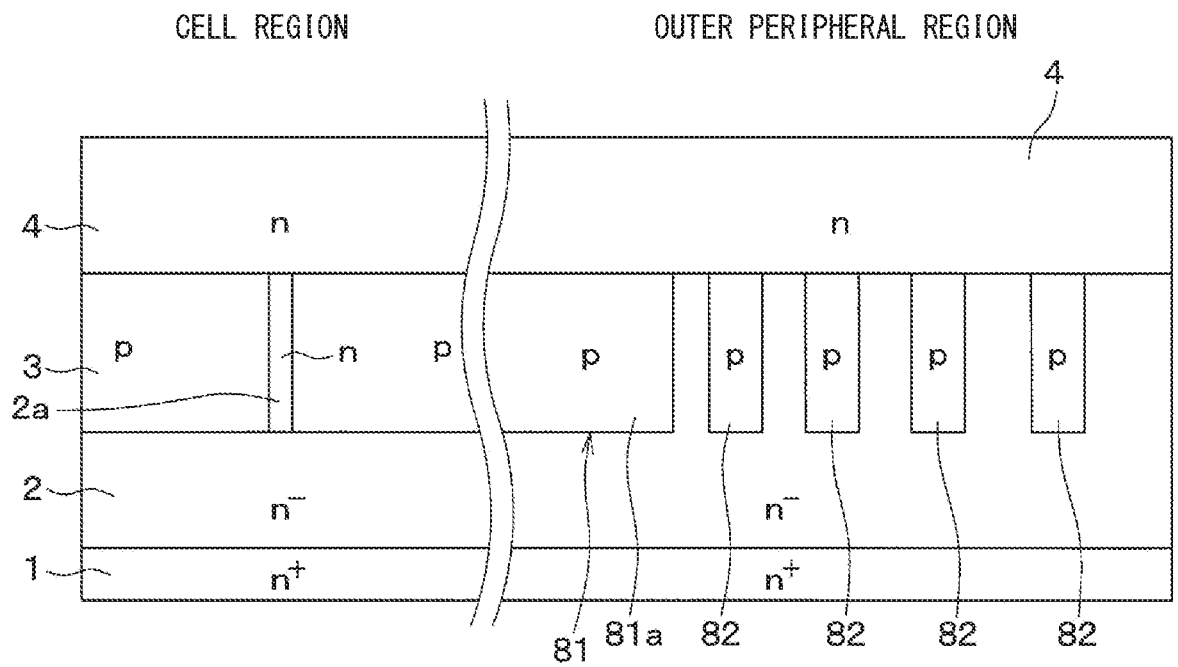
FIG. 19D is a cross-sectional view showing a manufacturing process of the SiC semiconductor device continued from FIG. 19C.
Figure 19E:
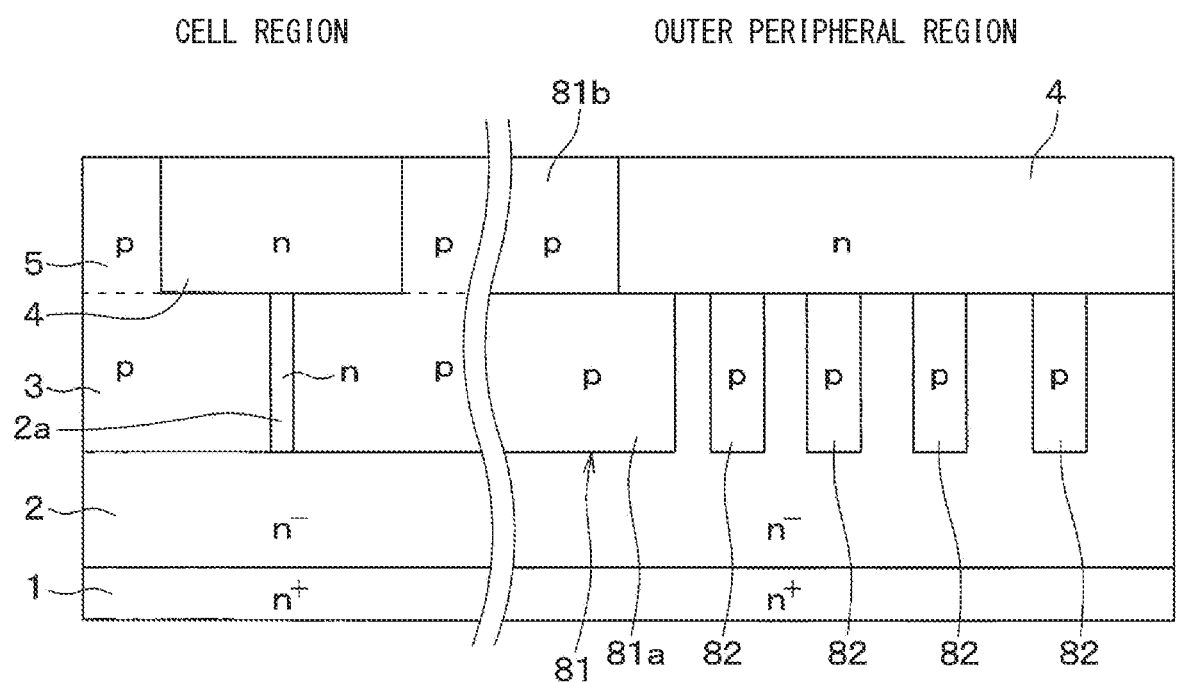
FIG. 19E is a cross-sectional view showing a manufacturing process of the SiC semiconductor device continued from FIG. 19D.

Next, as processes shown in FIG. 19B and FIG. 19C, the trench 3a and the JFET portion 2a are formed in the cell region as in the processes shown in FIG. 5B and FIG. 5C. In a process shown in FIG. 19D, when then n type current dispersion layer 4 is epitaxially grown as in the process shown in FIG. 5D, the n type current dispersion layer 4 is epitaxially grown also in the outer peripheral region. In a process shown in FIG. 19E, when the ion-implantation is performed at the time of forming the p type connection layer 5 as in the process shown in FIG. 5E, an upper layer portion 81b of the p type RESURF layer 81 is simultaneously formed.

Figure 19F:
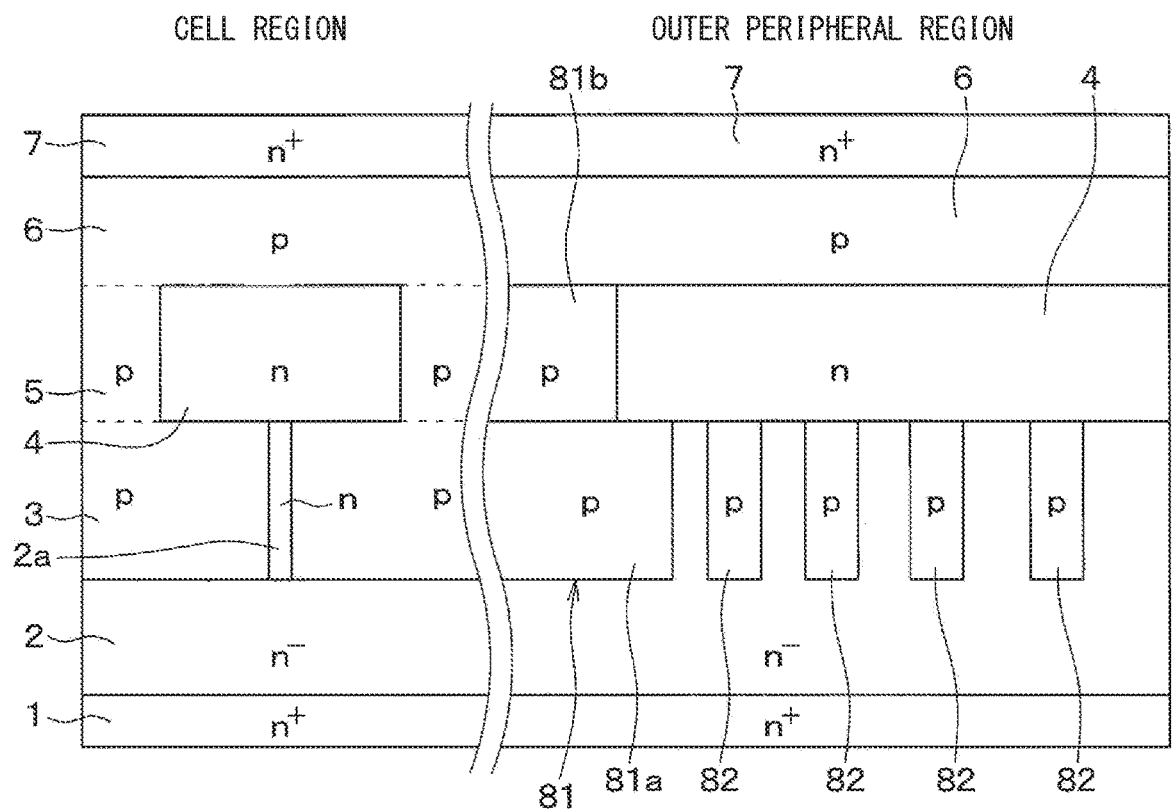
FIG. 19F is a cross-sectional view showing a manufacturing process of the SiC semiconductor device continued from FIG. 19E.
Figure 19G:
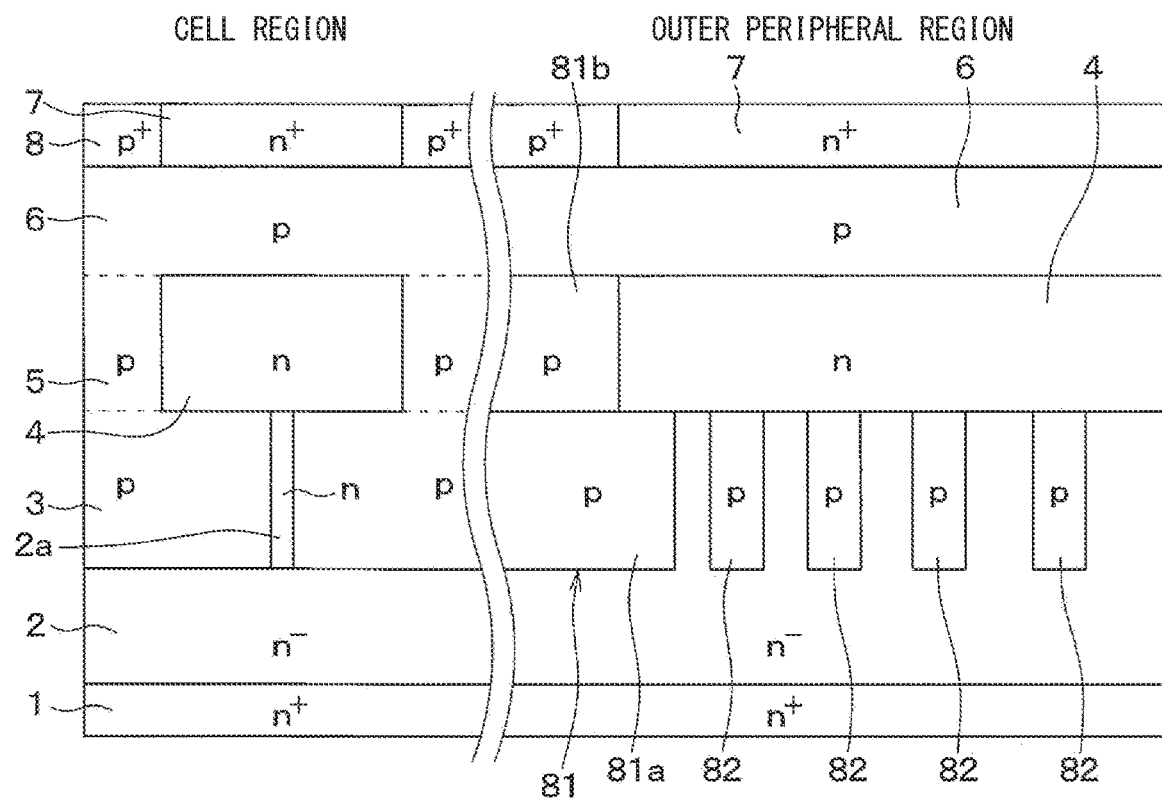
FIG. 19G is a cross-sectional view showing a manufacturing process of the SiC semiconductor device continued from FIG. 19F.

Next, in a process shown in FIG. 19F, when the p type base region 6 and the n+ type source region 7 are epitaxially grown as in the process shown in FIG. 5F, simultaneously, the p type base region 6 and the n+ type source region 7 are epitaxially grown also in the outer peripheral region. In a process shown in FIG. 19G, the $p^+$ type contact region 8 is formed in the cell region as in the process shown in FIG. 5G.

Figure 19H:
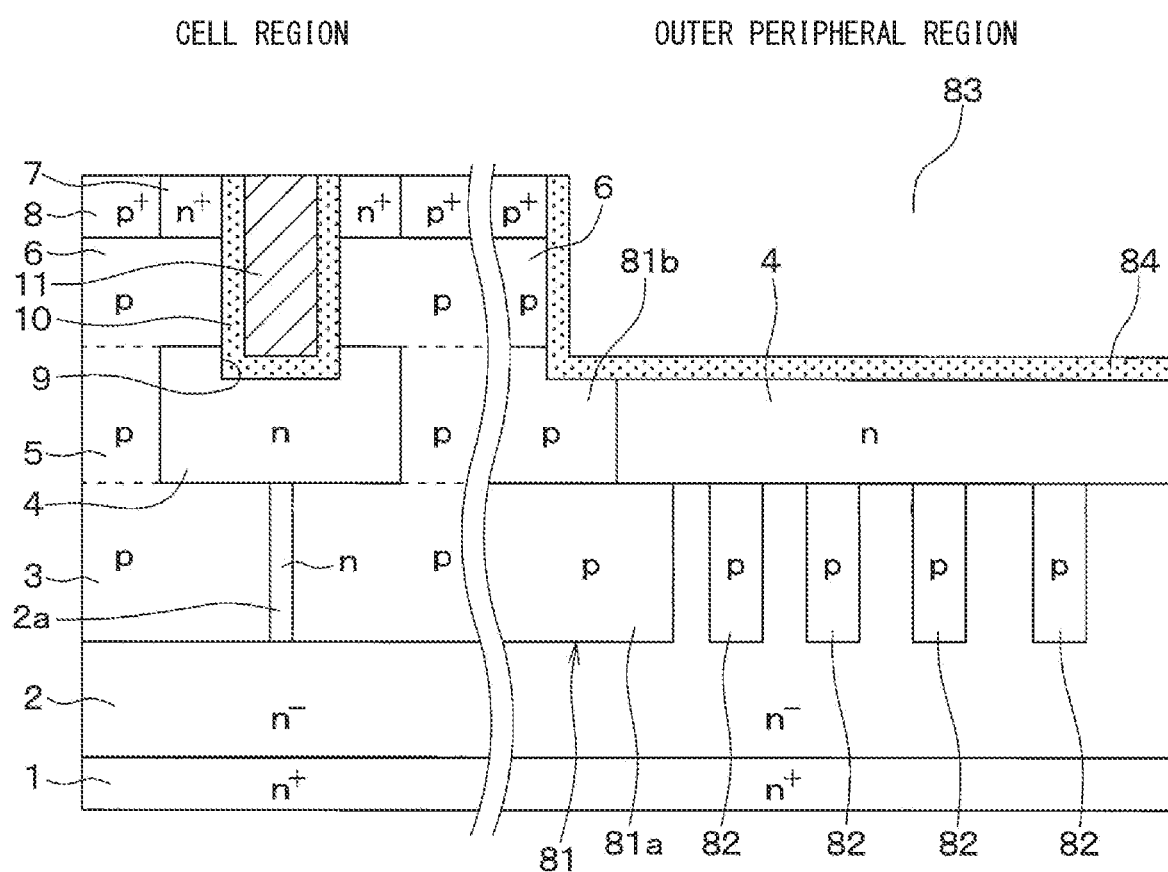
FIG. 19H is a cross-sectional view showing a manufacturing process of the SiC semiconductor device continued from FIG. 19G.

Further, in a process shown in FIG. 19H, when the gate trench 9 is formed as in the process shown in FIG. 5H, simultaneously an outer peripheral trench 83 penetrating the p type base region 6 and the $n^+$ type source region 7 and reaching the n type current dispersion layer 4 is formed in the outer peripheral region. When the gate insulation film 10 is formed, simultaneously, an insulation film 84 is formed in the outer peripheral trench 83. Although the Poly-Si is deposited in the outer peripheral region at the time of forming the gate electrode 11. However, the Poly-Si is etched back and removed.

Figure 19I:
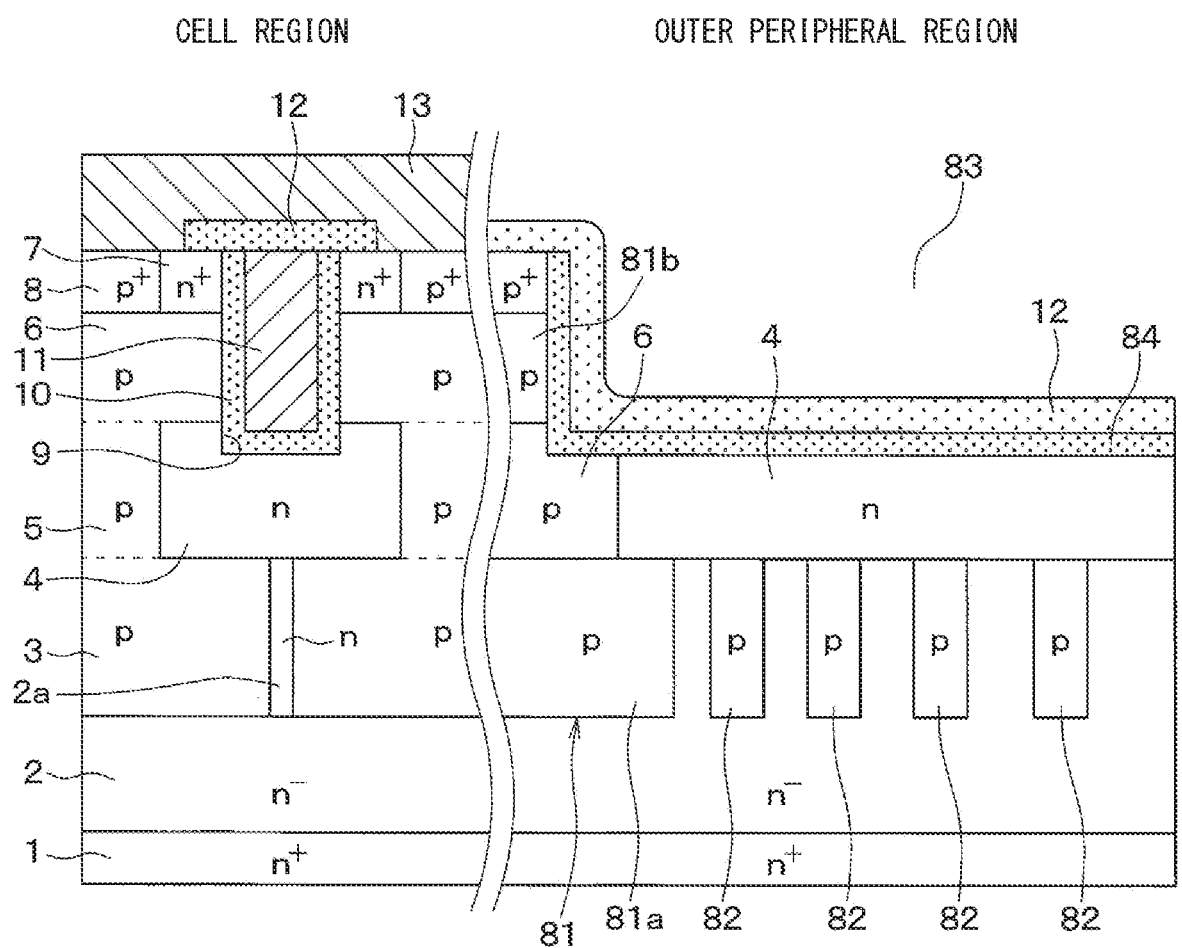
FIG. 19I is a cross-sectional view showing a manufacturing process of the SiC semiconductor device continued from FIG. 19H.

Thereafter, in a process shown in FIG. 19I, the interlayer insulation film 12 is formed as in the process shown in FIG. 5I, the interlayer insulation film 12 is formed also in the outer peripheral trench 83. Thereafter, the source electrode 13 or the like is formed in the cell region. However, an electrode material is removed at the time of patterning in a region other than a necessary portion of the outer peripheral region. Finally, the SiC semiconductor device according to the present embodiment is completed by forming the drain electrode 14 on the back surface of the $n^+$ type substrate 1.

In such a manner, when the vertical MOSFET having the configuration of the first embodiment or the like is formed, the outer peripheral withstand voltage structure can be also simultaneously formed in the outer peripheral region. Thereby, it may be possible to simplify the manufacturing process of the SiC semiconductor device.

Other Embodiments

Although the present disclosure is made with reference to the embodiments described above, the present disclosure is not limited to such embodiments but may include various changes and modifications which are within equivalent ranges. In addition, various combinations and forms, and other combinations and forms including only one element, more, or less than them are also included in the scope and concept of the present disclosure.

For example, the above embodiments are not independent of each other, and can be appropriately combined together except when the combination is obviously impossible.

Furthermore, the width of the JFET portion 2a does not need to be constant in the entire region in the depth direction, and may have, for example, a tapered cross-section such that the width gradually decreases toward the drain electrode 14. As described in the first and fifth embodiments or the like, it may be sufficient that the layout of the JFET portion 2a includes, at least, the linear portion when viewed from the normal direction of the n+ type substrate 1. It may be sufficient that the width at the linear portion satisfies the pinch-off condition.

The impurity concentration of each portion may not be constant. For example, the structure may be a structure having an impurity concentration gradient in which, the p type impurity concentration decreases as the p type deep layer 3 approaches the drain electrode 14, and the p type impurity concentration increases as the p type deep layer 3 approaches the source electrode 13.

Similarly, the dimension and the impurity concentration of each portion configuring the SiC semiconductor device described in each of the embodiments described above, are merely examples. The dimension and the impurity concentration of each portion may be appropriately set based on the pinch-off condition of the JFET portion 2a or the like.

In one example, the half cell pitch can be set to be wider or the like, that is, the half cell pitch can be changed. For example, the half cell pitch can be set to 3 μm. The thickness of the n type current dispersion layer 4 or the p type connection layer 5 can be thin, and the impurity concentration can be high. For example, the thickness is 0.4 μm. The n type impurity concentration or the p type impurity concentration of each of the n type current dispersion layer 4 or the p type connection layer 5 can be $6.0 \times 10^{17}/cm^3$. The thickness of the p type deep layer 3 can be thin, and the impurity concentration can be high. For example, the thickness is 0.6 μm. The p type impurity concentration can be $2.0 \times 10^{18}/cm^3$. However, these described here are also examples, and other dimensions and impurity concentrations may be used.

In the eighth embodiment described above, the p type layer 61 is formed by embedding the trench 60. However, the similar structure can be formed by the ion-implantation. That is, after the epitaxial growth of the n type current dispersion layer 4, the p type base region 6, and the n+ type source region 7 are continuously performed, the mask opening the region in which the p type layer 61 is to be formed is placed on the n+ type source region 7. With use of the mask, the p type impurities are ion-implanted. In such a manner, the p type layer 61 functioning as the p type connection layer 5 and the p⁺ type contact region 8 can be simultaneously formed by using the same mask. Therefore, it may be possible to simplify the manufacturing process, and reduce the manufacturing cost.

In the first embodiment or the like, the n channel vertical MOSFET in which the first conductivity type is n type and the second conductivity type is p type is described as an example. However, a p channel type vertical MOSFET in which the conductivity types of respective constituent are inverted may be used. In the above description, the vertical MOSFET has been described as an example of the semiconductor element. However, the present disclosure is applicable to an IGBT which has a similar structure. In the IGBT, only the conductivity type of the n⁺ type substrate 1 is changed from the n type to the p type with respect to each of the above embodiments, and other structures and manufacturing methods are the same as those of the above embodiments.

Although, as the semiconductor device, the SiC semiconductor device has been described as an example in the embodiments described above, the present disclosure can be applied to a semiconductor device using Si. Specifically, each of the above embodiments can be applied to a wide band gap semiconductor device, for example, a semiconductor device using GaN, diamond, AlN, or the like.

The invention claimed is:

1. A semiconductor device comprising:
an inversion type semiconductor element that includes:
    a substrate having a first conductivity type or a second conductivity type and made of semiconductor;
    a first conductivity type layer formed on the substrate and made of a semiconductor having the first conductivity type with an impurity concentration lower than an impurity concentration of the substrate;
    a second conductivity type region that is formed on the first conductivity type layer, and is made of a semiconductor having the second conductivity type;
    a JFET portion that is formed on the first conductivity type layer, is sandwiched by the second conductivity type region to be placed, and has, at least, a striped shape when the JFET portion is viewed from a normal direction of the substrate;
    a source region that is formed on the second conductivity region, and is made of a semiconductor having the first conductivity type and a concentration higher than a concentration of the first conductivity type layer;
    a gate insulation film formed on a channel region that is a part of the second conductivity type region;
    a gate electrode formed on the gate insulation film;
    an interlayer insulation film covering the gate electrode and the gate insulation film, and including a contact hole;
    a source electrode electrically connected to the source region through the contact hole; and
    a drain electrode formed on a back side of the substrate, forms the channel region by applying a gate voltage to the gate electrode and applying a voltage at a normal operation as a drain voltage to the drain electrode, and causes a current to flow between the source electrode and the drain electrode through the source region and the JFET portion,
wherein:
    when the voltage at the normal operation is applied as the drain voltage, the JFET portion causes the current to flow while suppressing an extension amount of a depletion layer extending from the second conductivity type region;
    when a voltage higher than the voltage at the normal voltage is applied as the drain voltage, the JFET portion is pinched off by the depletion layer; and
    when a width at the linear portion in the JFET portion is defined as W, a first conductivity type impurity concentration of the JFET portion is defined as Nd, a second type impurity concentration of a portion sandwiching the JFET portion in the second conductivity type region is defined as Na, an elementary charge is defined as q, and a dielectric constant of the semiconductor is defined as ε, a mathematical expression of $90\,[V] > (q \times Nd \times (Na+Nd) \times W^2)/2\varepsilon Na$ is satisfied.

2. The semiconductor device according to claim 1, wherein:
the second conductivity type region includes
    a deep layer formed on the first conductivity type layer,
    a base region that is connected to the source electrode and includes the channel region, and
    a connection layer that is formed on the deep layer, connects the deep layer and the base region, and has the second conductivity type;
a current dispersion layer that has a width wider than a width of the JFET portion and the first conductivity type and is formed on the deep layer and the JFET portion;
the base region is formed on the current dispersion layer;
when the voltage at the normal operation is applied as the drain voltage, the current flows through the JFET portion and the current dispersion layer; and
when the drain voltage becomes higher than the voltage at the normal operation, the JFET portion is pinched off earlier than the current dispersion layer.

3. The semiconductor device according to claim 2, wherein:
a high concentration layer is formed between the JFET portion and the first conductivity type layer and between the second conductivity type region and the first conductivity type layer, has an impurity concentration higher than an impurity concentration of the first conductive type layer, and has the first conductivity type.

4. The semiconductor device according to claim 2, wherein:
a gate trench that penetrates the source region and the base region and reaches the current dispersion layer is formed;
a trench gate structure is configured by forming the gate insulation film and the gate electrode inside the gate trench; and
the width at the linear portion in the JFET portion is smaller than a width of the gate trench.

5. The semiconductor device according to claim 4, wherein:
the trench gate structure includes a plurality of trench gate structures;
the plurality of trench gate structures are formed in a stripe shape by setting one direction of each of the plurality of trench gate structures to a longitudinal direction and extending; and
the JFET portion is formed in a strip shape in which the linear portion extends in the longitudinal direction of the trench gate structure.

6. The semiconductor device according to claim 4, wherein:
the trench gate structure includes a plurality of trench gate structures;
the plurality of trench gate structures are formed in a stripe shape by setting one direction of each of the plurality of trench gate structures to a longitudinal direction and extending in the longitudinal direction;
the JFET portion includes a plurality of JFET portions;
a direction intersecting with the longitudinal direction of the trench gate structure is a longitudinal direction of each of the plurality of JFET portions; and
the plurality of JFET portions extend in the longitudinal direction.

7. The semiconductor device according to claim 1, wherein:
the width at the linear portion in the JFET portion is 0.3 µm or less.

8. The semiconductor device according to claim 1, wherein:
the semiconductor is a wide band gap semiconductor.

9. A method for manufacturing a semiconductor device, comprising:
preparing a substrate made of semiconductor having a first conductivity type or a second conductivity type;
forming a first conductivity type layer, made of a semiconductor having the first conductivity type with an impurity concentration lower than an impurity concentration of the substrate, on the substrate;
forming a deep layer, made of a semiconductor having the second conductivity type, on the first conductivity type layer;
forming a JFET portion on the first conductivity type layer, wherein the JFET portion is sandwiched by the deep layer and has, at least, a linear portion when the JFET portion is viewed from a normal direction of the substrate;
forming the current dispersion layer on the deep layer and the JFET portion, wherein a width of the current dispersion layer is wider than a width of the JFET portion, and the current dispersion layer is connected to the JFET portion;
forming a connection layer, made of a semiconductor having the second conductivity type, on the deep layer, wherein the JFET portion is connected to the deep layer;
forming a base region, made of a semiconductor having the second conductivity type, on the current dispersion layer and the connection layer, wherein the base region is connected to the connection layer;
forming a source region on the base region, wherein the source region is made of a semiconductor having the first conductivity type and a concentration higher than a concentration of the first conductivity type layer;
forming a gate insulation film on a channel region that is a part of the base region;
forming a gate electrode on the gate insulation film;
forming an interlayer insulation film covering the gate electrode and the gate insulation film, and including a contact hole;
forming a source electrode electrically connected to the source region through the contact hole;
forming a drain electrode on a back side of the substrate, wherein:
due to the forming the JFET portion, when a gate voltage is applied to the gate electrode and a normal voltage at a normal operation is applied, as a drain voltage, to a drain electrode, a current flows between the source electrode and the drain electrode by suppressing an extension amount of a depletion layer extending from the deep layer;
when a voltage higher than the voltage at the normal operation is applied as the drain voltage, the JFET portion is pinched off by the depletion layer;
an inversion type semiconductor element forms the JFET portion; and
when a width at the linear portion in the JFET portion is defined as W, a first conductivity type impurity concentration of the JFET portion is defined as Nd, a second type impurity concentration of the deep layer is defined as Na, an elementary charge is defined as q, and a dielectric constant of the semiconductor is defined as ε, the JFET portion is formed so that a mathematical expression of $90\ [V] > (q \times Nd \times (Na+Nd) \times W^2)/2\varepsilon Na$ is satisfied.

10. The method for manufacturing the semiconductor device according to claim 9, wherein:
the forming the JFET portion is forming the JFET portion by embedding a first conductivity type semiconductor that has an impurity concentration higher than an impurity concentration of the first conductivity type layer by epitaxial growth in a trench after removing a part of the deep layer and forming the trench.

11. A method for manufacturing a semiconductor device, comprising:
preparing a substrate made of a semiconductor having a first conductivity type or a second conductivity type;
forming a first conductivity type layer, made of a semiconductor having the first conductivity type with an impurity concentration lower than an impurity concentration of the substrate, on the substrate;
forming a deep layer, made of a semiconductor having the second conductivity type, on the first conductivity type layer;
forming a JFET portion on the first conductivity type layer, wherein the JFET portion is sandwiched by the deep layer and has, at least, a linear portion when the JFET portion is viewed from a normal direction of the substrate;
forming a current dispersion layer on the deep layer and the JFET portion, wherein the current dispersion layer has a width wider than a width of the JFET portion, is connected to the JFET portion, and is made of a semiconductor having the first conductivity type;
forming a base region, made of a semiconductor having the second conductivity type, on the current dispersion layer;
forming a source region on the base region, wherein the source region is made of a semiconductor having the first conductivity type and a concentration higher than a concentration of the first conductivity type layer;
forming a gate insulation film on a channel region that is a part of the base region;
forming a gate electrode on the gate insulation film;
forming a second conductivity type region that extends from a surface of the source region to the deep layer, functions as a connection layer connected to the base region and the deep layer, and functions as a contact region that has the second conductivity type;
forming an interlayer insulation film covering the gate electrode and the gate insulation film, and including a contact hole;
forming a source electrode electrically connected to the source region through the contact hole;

forming a drain electrode on a back side of the substrate, wherein:

due to the forming the JFET portion, when a gate voltage is applied to the gate electrode and a normal voltage at a normal operation is applied, as a drain voltage, to a drain electrode, a current flows between the source electrode and the drain electrode by suppressing an extension amount of a depletion layer extending from the deep layer;

when a voltage higher than the voltage at the normal operation is applied as the drain voltage, the JFET portion is pinched off by the depletion layer; and the semiconductor device includes an inversion type semiconductor element that forms the JFET portion; and when a width at the linear portion in the JFET portion is defined as W, a first conductivity type impurity concentration of the JFET portion is defined as Nd, a second type impurity concentration of the deep layer is defined as Na, an elementary charge is defined as q, and a dielectric constant of the semiconductor is defined as ε, the JFET portion is formed so that a mathematical expression of $90\ [V] > (q \times Nd \times (Na+Nd) \times W^2)/2\varepsilon Na$ is satisfied.

12. The semiconductor device according to claim 11, wherein:

the forming the second conductivity type region is forming the semiconductor conductivity type region by embedding a second conductivity type semiconductor in a trench after forming the trench extending from a surface of the source region to the deep layer.

13. The semiconductor device according to claim 11, wherein:

the forming the second conductivity type region is forming the second conductivity type region extending from a surface of the source region to the deep layer by ion-implanting a second conductivity type impurity.

14. The method for manufacturing the semiconductor device according to claim 11, wherein:

the forming the JFET portion is forming the JFET portion by embedding a first conductivity type semiconductor that has an impurity concentration higher than an impurity concentration of the first conductivity type layer by epitaxial growth in a trench after removing a part of the deep layer and forming the trench;

a temperature is kept by using an identical epitaxial growth device;

after the JFET portion is formed, a portion other than a portion that becomes the JFET portion in the first conductivity type semiconductor is etched back by hydrogen etching to be removed; and after the portion other than the portion that becomes the JFET portion is removed, subsequently, the current dispersion layer is formed, the base region is formed, and the source region is formed.

15. The method for manufacturing the semiconductor device according to claim 14, wherein:

the forming the JFET portion includes supplying source gas of the semiconductor without supplying a first conductivity impurity dopant at an initial growth stage of the epitaxial growth and starting a supply of the first conductivity type impurity dopant after the growth initial stage.

16. The method for manufacturing the semiconductor device according to claim 15, wherein:

the semiconductor is silicon carbide; and the forming the JFET portion includes supplying the source gas of the semiconductor without supplying a first conductivity impurity dopant at the initial growth stage for 5 to 60 seconds and thereafter starting the supply of the first conductivity type impurity dopant.

* * * * *